US012394461B2

(12) United States Patent
Waller

(10) Patent No.: US 12,394,461 B2
(45) Date of Patent: Aug. 19, 2025

(54) MULTI-DECK NON-VOLATILE MEMORY ARCHITECTURE WITH IMPROVED ADDRESS LINE DRIVER CIRCUITRY

(71) Applicant: Intel Corporation, Santa Clara, CA (US)

(72) Inventor: William K. Waller, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 644 days.

(21) Appl. No.: 17/688,357

(22) Filed: Mar. 7, 2022

(65) Prior Publication Data

US 2023/0282259 A1   Sep. 7, 2023

(51) Int. Cl.
| | | |
|---|---|---|
| *G11C 8/10* | (2006.01) | |
| *G06F 3/06* | (2006.01) | |
| *G11C 7/12* | (2006.01) | |
| *G11C 7/18* | (2006.01) | |
| *G11C 8/08* | (2006.01) | |
| *G11C 8/14* | (2006.01) | |

(52) U.S. Cl.
CPC .............. *G11C 8/10* (2013.01); *G06F 3/0604* (2013.01); *G06F 3/0655* (2013.01); *G06F 3/0679* (2013.01); *G11C 7/12* (2013.01); *G11C 7/18* (2013.01); *G11C 8/08* (2013.01); *G11C 8/14* (2013.01)

(58) Field of Classification Search
CPC .... G11C 8/10; G11C 7/12; G11C 7/18; G11C 8/08; G11C 8/14; G11C 5/063; G11C 5/025; G11C 8/12; G06F 3/0604; G06F 3/0655; G06F 3/0679
See application file for complete search history.

(56) References Cited

U.S. PATENT DOCUMENTS

| | | | | |
|---|---|---|---|---|
| 7,460,430 B2* | 12/2008 | Kim | ........................ | G11C 8/08 |
| | | | | 365/230.01 |
| 9,251,878 B2* | 2/2016 | Kim | ..................... | G11C 11/4085 |
| 10,558,575 B2* | 2/2020 | Fleming, Jr. | .......... | G06F 9/3861 |
| 2005/0207203 A1* | 9/2005 | Kang | ..................... | G11C 11/22 |
| | | | | 365/145 |
| 2007/0230245 A1* | 10/2007 | Watanabe | ................ | G11C 8/12 |
| | | | | 365/185.09 |
| 2008/0253159 A1* | 10/2008 | Kajigaya | .............. | G11C 7/1078 |
| | | | | 365/51 |
| 2009/0175063 A1* | 7/2009 | Park | ........................ | G11C 8/08 |
| | | | | 365/205 |
| 2010/0284209 A1* | 11/2010 | Kim | ........................ | G11C 11/14 |
| | | | | 365/230.06 |
| 2019/0004878 A1* | 1/2019 | Adler | ..................... | G06F 21/629 |
| 2019/0019555 A1* | 1/2019 | Lee | ..................... | G11C 16/0483 |
| 2022/0101909 A1* | 3/2022 | Waller | ................ | G11C 7/1012 |

* cited by examiner

*Primary Examiner* — Khamdan N. Alrobaie
(74) *Attorney, Agent, or Firm* — Alliance IP, LLC

(57) ABSTRACT

In one embodiment, a non-volatile memory apparatus includes a plurality of memory tiles that each include a set of main memory tiles arranged in rows and columns and a set of row termination tiles at the ends of the rows and a set of column termination tiles at the ends of the columns. Each main memory tile includes a set of address lines orthogonal to one another, memory cells between the overlapping areas of the orthogonal address lines, address line driver circuitry, and circuitry to selectively couple the address line driver circuitry to an address line decoder circuit of an adjacent memory tile to activate address lines in the main memory tile.

20 Claims, 15 Drawing Sheets

MULTI-DECK NON-VOLATILE MEMORY ARCHITECTURE WITH IMPROVED ADDRESS LINE DRIVER CIRCUITRY

FIELD

The present disclosure relates in general to the field of computer memory structures, and more specifically, to a multi-deck non-volatile memory architecture with improved address line driver circuitry.

BACKGROUND

A storage device may include non-volatile memory, and three-dimensional memory cells have emerged as a solution to certain scaling limitations of traditional memory devices. Such three-dimensional memory cells may include a multi-deck non-volatile memory architecture that includes main tiles that are used for memory accesses (reads and writes) and termination tiles that surround the main tiles.

BRIEF DESCRIPTION OF THE DRAWINGS

Like reference numbers and designations in the various drawings indicate like elements.

DETAILED DESCRIPTION

A variety of memory and storage technologies include multiple decks or layers of memory cells as part of the vertical address space. Adding decks or layers of memory cells may result in a larger memory size per the same die size. Memory with multiple decks or layers (e.g., a multi-deck architecture in the vertical direction) is typically referred to as three-dimensional (3D). Examples of multi-deck or multi-layer memory architectures include multi-deck crosspoint memory and 3D NAND memory. Different memory technologies have adopted different terminology. For example, a deck in a crosspoint memory device typically refers to a layer of memory cell stacks that can be individually addressed. In contrast, a 3D NAND memory device is typically said to include a NAND array that includes many layers, as opposed to decks. In 3D NAND, a deck may refer to a subset of layers of memory cells (e.g., two decks of X-layers to effectively provide a 2x-layer NAND device). The term "deck" will be used throughout this disclosure to describe a layer, a tier, or a similar portion of a three-dimensional memory.

Figure 1:
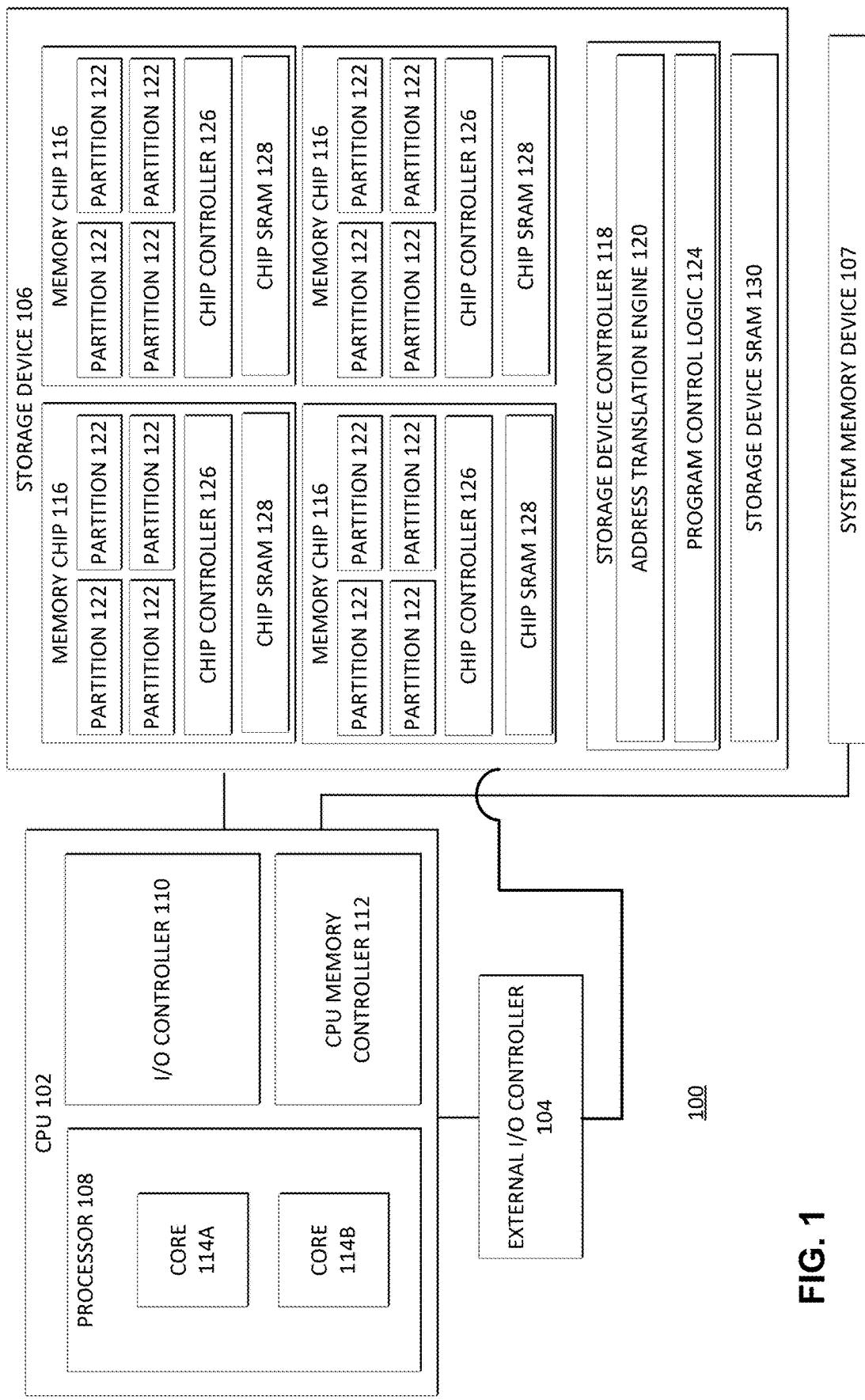
FIG. 1 is a schematic illustration of a block diagram of components of a computer system according to some embodiments.

FIG. 1 illustrates a block diagram of components of a computer system 100 in accordance with some embodiments. System 100 includes a central processing unit (CPU) 102 coupled to an external input/output (I/O) controller 104, a storage device 106 such as a solid state drive (SSD), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition 122 may include a 3D crosspoint memory array. In some embodiments, a 3D crosspoint memory array may comprise a transistor-less (e.g., at least with respect to the data storage elements of the memory) stackable crosspoint architecture in which memory cells sit at the intersection of row address lines and column address lines arranged in a grid.

During a read operation, a differential bias sometimes referred to as a demarcation voltage (VDM) may be applied across the terminals of the memory cell and the state of the memory cell may be sensed based on the reaction of the memory cell to the applied bias. For example, the memory cell may either go into a conductive ON state (logic one) or remain in a weakly conductive OFF state (logic zero). The applied voltage at which a memory cell transitions from being sensed as a logic one to being sensed as a logic zero may be termed a threshold voltage of the memory cell. Thus, as an example, when the VDM is higher than the threshold voltage of the memory cell, the memory cell may be sensed as storing a logic one and when the VDM is lower than the threshold voltage of the memory cell, the memory cell may be sensed as storing a logic zero.

CPU 102 comprises a processor 108, such as a microprocessor, an embedded processor, a digital signal processor (DSP), a network processor, a handheld processor, an application processor, a co-processor, an SOC, or other device to execute code (e.g., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

A processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

The processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable logic capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise storage device controller 118 of storage device 106 coupled to the CPU 102 through I/O controller 110. I/O circuitry (not shown) of the storage device controller 118 may be used for communication of data and signals between the CPU and the storage device controller 118 of storage device 106.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and an associated I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller 110 may be located off-chip (e.g., not on the same chip as CPU 102) or may be integrated on the same chip as the CPU 102.

CPU memory controller 112 is an integrated memory controller that controls the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces. According to an alternative embodiment, the external I/O controller 104 may be used to couple of the CPU 102 to I/O devices other than the storage device 106, and the storage device 106 may be directly coupled to the CPU 102.

In the instant disclosure, I/O controller 110, CPU memory controller 112, external I/O controller 104 may each be referred to, from the standpoint of the storage device 106, as an "external controller."

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store temporary data, persistent data (e.g., a user's files or instruction sequences) that maintains its state even after power to the system memory device 107 is removed, or a combination thereof. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory partition may include non-volatile memory and/or volatile memory.

Non-volatile memory is a storage medium that does not require power to maintain the state of data stored by the medium, thus non-volatile memory may have a determinate state even if power is interrupted to the device housing the memory. In various embodiments, non-volatile memory may be byte or block addressable. Nonlimiting examples of nonvolatile memory may include any or a combination of: solid state memory (such as planar or 3-dimensional (3D) NAND flash memory or NOR flash memory), 3D crosspoint memory, phase change memory or SXP memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium (thus volatile memory is memory whose state (and therefore the data stored on it) is indeterminate if power is interrupted to the device housing the memory). Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications.

A storage device 106 may store any suitable data, such as data used by processor 108 to provide functionality of computer system 100. For example, data associated with programs that are executed or files accessed by cores 114A and 114B may be stored in storage device 106. A storage device 106 may store data and/or sequences of instructions that are executed or otherwise used by the cores 114A and 114B. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data. The cells of a memory partition 122 may be arranged in any suitable fashion, such as in rows (e.g., wordlines) and columns (e.g., bitlines), three-dimensional structures, sectors, or in other ways. In various embodiments, the cells may be logically grouped into banks, blocks, subblocks, wordlines, pages, frames, bytes, slices, or other suitable groups. In various embodiments, a memory partition 122 may include any of the volatile or non-volatile memories listed above or other suitable memory. In a particular embodiment, each memory partition 122 comprises one or more 3D crosspoint memory arrays. 3D crosspoint arrays are described in more detail in connection with the following figures.

In various embodiments, storage device 106 may comprise a solid state drive; a memory card; a Universal Serial Bus (USB) drive; a Non-Volatile Dual In-line Memory Module (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

System memory device 107 and storage device 106 may comprise any suitable types of memory and are not limited to a particular speed, technology, or form factor of memory in various embodiments. For example, a storage device 106 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Similarly, system memory 107 may have any suitable form factor. Moreover, computer system 100 may include multiple different types of storage devices.

System memory device 107 or storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A system memory device 107 or storage device 106 may also include a communication interface to communicate with CPU memory controller 112 or I/O controller 110 in accordance with any suitable logical device interface specification such as NVMe, AHCI, or other suitable specification. In particular embodiments, system memory device 107 or storage device 106 may comprise multiple communication interfaces that each communicate using a separate protocol with CPU memory controller 112 and/or I/O controller 110.

Storage device controller 118 may include logic to receive requests from CPU 102 (e.g., via an interface that communicates with CPU memory controller 112 or I/O controller 110), cause the requests to be carried out with respect to the memory chips 116, and provide data associated with the requests to CPU 102 (e.g., via CPU memory controller 112 or I/O controller 110). Storage device controller 118 may also be operable to detect and/or correct errors encountered during memory operations via an error correction code (ECC engine). In an embodiment, controller 118 also tracks, e.g., via a wear leveling engine, the number of times particular cells (or logical groupings of cells) have been written to in order to perform wear leveling, detect when cells are nearing an estimated number of times they may be reliably written to, and/or adjust read operations based on the number of times cells have been written to. In performing wear leveling, the storage device controller 118 may evenly spread out write operations among the cells of memory chips 116 in an attempt to equalize the number of operations (e.g., write operations) performed by each cell. In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

In various embodiments, the storage device controller 118 may send commands to memory chips 116 to perform host-initiated read operations as well as device-initiated read operations. A host-initiated read operation may be performed in response to reception of a read command from a host coupled to the storage device 106, such as CPU 102. A device-initiated read operation may be a read operation that is performed in response to a device-initiated read command generated by the storage device 106 independent of receiving a read command from the host. In various embodiments, the storage device controller 118 may be the component that generates device-initiated read commands. The storage device 106 may initiate a device-initiated read command for any suitable reason. For example, upon power up of a storage device, the storage device 106 may initiate a plurality of read and write-back commands to re-initialize data of the storage device 106 (e.g., to account for any drift that has occurred while the storage device 106 or a portion thereof was powered off or has sat idle for a long period of time).

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (e.g., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Storage device SRAM/DRAM 130 and chip SRAM/DRAM 128 each are adapted to execute internal firmware or software of the storage device 106 and memory chip 116, respectively. For example, the logic to be implemented by program control logic 124, upon the issuance of a command, for example from the host or CPU 102 to execute the logic, may be moved from a memory storing the logic to SRAM/DRAM 130 such that the logic may be executed by the storage device controller 118 which will have access to the logic instructions by way of the associated SRAM/DRAM 128. Similarly, the logic to be implemented by the chip controller 126, upon the issuance of a command, for example from the host or CPU 102 to execute the logic, may be moved from a memory storage the logic to the associated SRAM/DRAM 128 (or another type of memory) such that the logic may be executed by the associated chip controller 126 which will have access to the logic instructions by way of the associated SRAM/DRAM 128.

Figure 2:
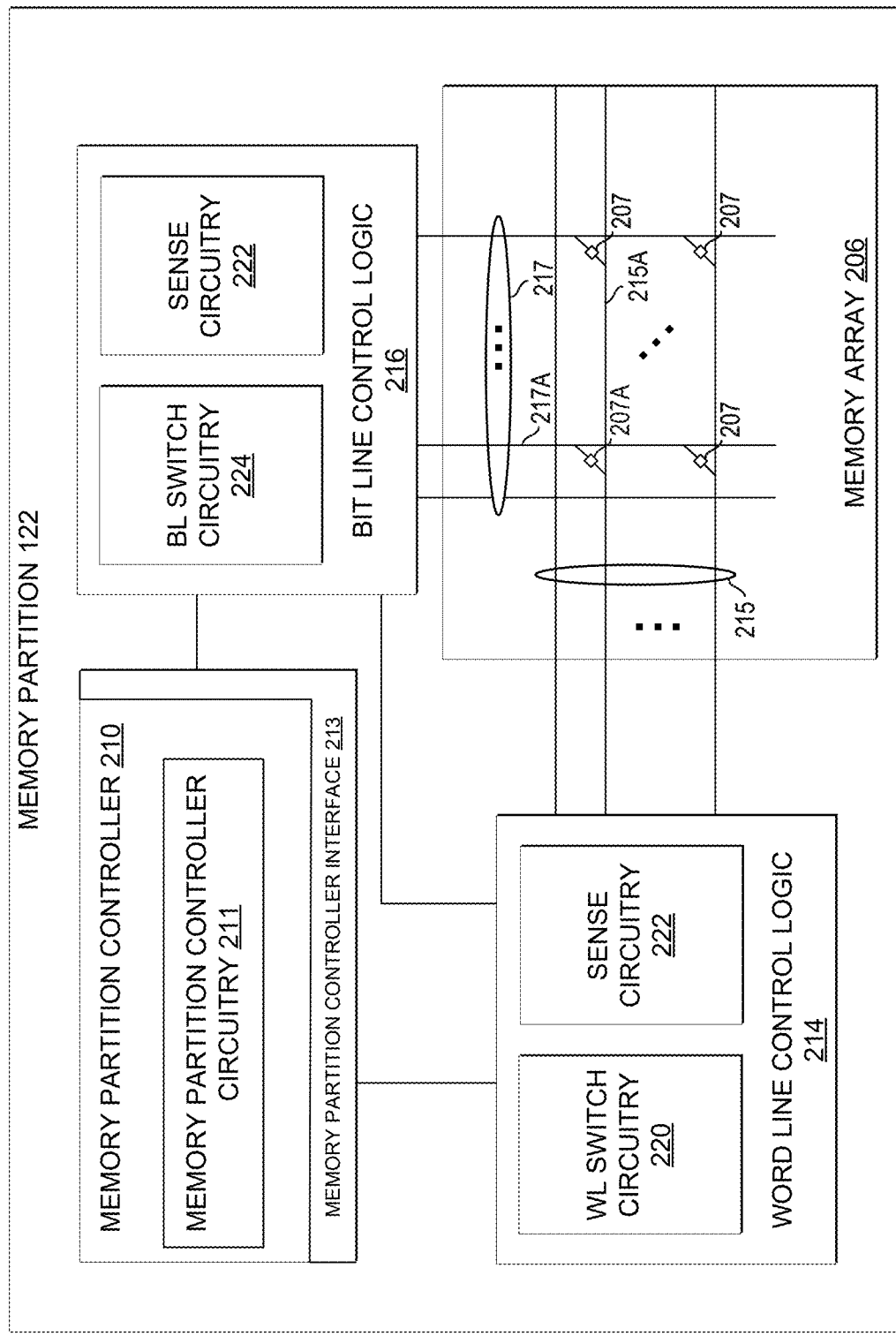
FIG. 2 is a schematic illustration of a memory partition in accordance with certain embodiments.

FIG. 2 illustrates a detailed exemplary view of the memory partition 122 of FIG. 1 in accordance with certain embodiments. In one embodiment, a memory partition 122 may include 3D crosspoint memory which may include phase change memory or other suitable memory types. In a particular embodiment, phase change memory may utilize a chalcogenide material for memory elements. A memory element is a unit of a memory cell that actually stores the information. In operation, phase change memory may store information on the memory element by changing the phase of the memory element between amorphous and crystalline phases. The memory element (e.g., that includes a phase change material such as a chalcogenide material) may be referred to as a "PM" portion of the memory cell. The material of a memory element (e.g., the chalcogenide material) may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one). The memory element may be included in a memory cell 207 (e.g., a phase change memory cell) that also includes a selector, e.g., a select device (SD) coupled to the memory element. The SD regions of the memory cell 207 may be configured to facilitate combining a plurality of memory elements into an array. The SD region of the memory cell 207 may be made of, or include, a chalcogenide material. The SD region may be made of a different chalcogenide material than the PM region.

In some embodiments, a 3D crosspoint memory array 206 may comprise a transistor-less (e.g., at least with respect to the data storage elements of the memory) stackable crosspoint architecture in which memory cells 207 sit at the intersection of row address lines and column address lines arranged in a grid. The row address lines 215 and column address lines 217, called word lines (WLs) and bit lines (BLs), respectively, cross in the formation of the grid and each memory cell 207 is coupled between a WL and a BL where the WL and BL cross (e.g., at a crosspoint). At the point of a crossing, the WL and BL may be located at different vertical planes such that the WL crosses over the BL but does not physically touch the BL. As described above, the architecture may be stackable, such that a word line may cross over a bit line located beneath the word line and another bit line for another memory cell located above the word line. It should be noted that row and column are terms of convenience used to provide a qualitative description of the arrangement of WLs and BLs in crosspoint memory. In various embodiments, the cells of the 3D crosspoint memory array may be individually addressable. In some embodiments, bit storage may be based on a change in bulk resistance of a 3D crosspoint memory cell. In various embodiments, 3D crosspoint memory may include any of the characteristics of 3D)(Point memory manufactured by INTEL CORPORATION (Optane™ is the Intel Trademark for Intel's 3D crosspoint (3D Xpoint™) technology).

During a programming operation (e.g., a write operation), the phase of the memory element may be changed by the application of a first bias voltage to the WL and a second bias voltage to the BL resulting in a differential bias voltage across the memory cell that may cause a current to flow in the memory element. The differential bias voltage may be maintained across the memory cell for a time period sufficient to cause the memory element to "snap back" and to transition the memory element from the amorphous state to the crystalline state or from the crystalline state to the amorphous state (e.g., via the application of heat produced by an electric current). Snap back is a property of the composite memory element that results in an abrupt change in conductivity and an associated abrupt change in the voltage across the memory element.

In a read operation, a target memory cell is selected via the application of a first bias voltage to the selected WL and a second bias voltage to the selected BL that cross at the target memory cell for a time interval. A resulting differential bias voltage (a demarcation read voltage (VDM)) across the memory element is configured to be greater than a maximum set voltage and less than a minimum reset voltage for the memory element. Selection of the selected WL and selected BL and application of the first bias and second bias voltage may be implemented by a decoder in a switch circuitry, such as WL switch circuitry 220 and BL switch circuitry 224. In response to application of the VDM, the target memory element may or may not snap back, depending on whether the memory element is in the crystalline state (set) or the amorphous state (reset). Sense circuitry, coupled to the memory element, is configured to detect the presence or absence of snap back in a sensing time interval. The presence of snap back may then be interpreted as a logic one and the absence of snap back as a logic zero.

The differential bias at which a memory cell transitions from being sensed as a logic one (e.g., due to the memory cell snapping back) to being sensed as a logic zero (e.g., due to the memory cell not snapping back), may be termed a threshold voltage (sometimes referred to as a snap back voltage). Thus, when the VDM is higher than the threshold voltage of the memory cell, the memory cell may be sensed as storing a logic one and when the VDM is lower than the threshold voltage of the memory cell, the memory cell may be sensed as storing a logic zero.

In some embodiments, an applied bias such as the VDM of a read pulse may be high enough to only turn on 3D crosspoint cells in the crystalline state, which may have a lower threshold voltage than 3D crosspoint cells in the amorphous state. In some embodiments, the VDM may be supplied through negative and/or positive regulated nodes. For example, the bitline electrode of the 3D crosspoint cell may be a positive regulated node and the wordline electrode coupled to the cell may supply the bias for VDM.

For a write operation or a read operation, one memory cell 207A out of many cells, such as thousands of cells, may be selected as the target cell for the read or write operation, the cell being at the cross section of a BL 217A and a WL 215A. All cells coupled to BL 217A and all cells coupled to WL 215A other than cell 207A may still receive a portion of VDM (e.g., approximately ½ of VDM), with only cell 207A receiving the full VDM.

In the embodiment of FIG. 2, a memory partition 122 includes memory partition controller 210, word line control logic 214, bit line control logic 216, and memory array 206. A host device (e.g., CPU 102) may provide read and/or write commands including memory address(es) and/or associated data to memory partition 122 (e.g., via storage device controller 118 and chip controller 126) and may receive read data from memory partition 122 (e.g., via the chip controller 126 and storage device controller 118). Similarly, storage device controller 118 may provide host-initiated read and write commands or device-initiated read and write commands including memory addresses to memory partition 122 (e.g., via chip controller 126). Memory partition controller 210 (in conjunction with word line control logic 214 and bit line control logic 216) is configured to perform memory access operations, e.g., reading one or more target memory cells and/or writing to one or more target memory cells.

Memory array 206 corresponds to at least a portion of a 3D crosspoint memory (e.g., that may include phase change memory cells or other suitable memory cells) and includes a plurality of word lines 215, a plurality of bit lines 217 and a plurality of memory cells, e.g., memory cells 207. Each memory cell is coupled between a word line ("WL") and a bit line ("BL") at a crosspoint of the WL and the BL. Each memory cell includes a memory element configured to store information and may include a memory cell select device (e.g., selector) coupled to the memory element. Select devices may include ovonic threshold switches, diodes, bipolar junction transistors, field-effect transistors, etc. Memory array 206 may be configured to store binary data and may be written to (e.g., programmed) or read from.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command. Memory partition controller 210 may include memory partition controller circuitry 211, and a memory controller interface 213. Memory controller interface 213, although shown as a single block in FIG. 2, may include a plurality of interfaces, for example a separate interface for each of the WL control logic 214 and the BL control logic 216.

WL control logic 214 includes WL switch circuitry 220 and sense circuitry 222. WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to a WL select bias voltage to select the respective WL 215A. For example, WL switch circuitry 220 may include a plurality of switches that each correspond to a particular WL. In one embodiment, each switch includes a pair of metal oxide semiconductor field effect transistors (MOSFETs) comprising a positive-type (p-type) metal oxide semiconductor transistor (PMOS) and a negative-type (n-type) MOS transistor (NMOS). The pair may form a complementary MOS circuit (CMOS).

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210. For example, a logic level corresponding to a logic one may be output if the applied VDM is higher than the memory cell's threshold voltage or a logic zero if the applied VDM is lower than the memory cell's threshold voltage. In a particular embodiment, a logic one may be output if a snap back is detected and a logic zero may be output if a snap back is not detected.

As an example, in response to a signal from memory partition controller 210, WL control logic 214 and BL control logic 216 may be configured to select a target memory cell, e.g., memory cell 207A, for a read operation by coupling WL 215A to WL select bias voltage and BL 217A to BL select bias voltage as well as coupling the other WLs and BLs to respective deselect bias voltages. One or both of sense circuitries 222 may then be configured to monitor WL 215A and/or BL 217A for a sensing interval in order to determine the state of the memory cell 207A (e.g., to determine whether or not a snap back event occurs). For example, if a sense circuitry 222 detects a snap back event, then memory cell 207A may be in the set state, but if a sense circuitry 222 does not detect a snap back event in the sensing interval, then memory cell 207A may be in the reset state.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a WL load connected to a WL electrode or gate, and a BL load connected to a BL electrode or gate. When a particular wordline and bitline are selected in the array, a difference between WL load or WL voltage and the BL voltage corresponds to a read VDM. VDM may induce a current (icell) in the memory cell 207A. A comparator such as a sense amplifier may compare icell with a reference current in order to read a logic state one or logic state zero depending on whether the memory cell is a set cell or a reset cell. The reference current may thus be selected such that the current of the target memory cell is lower than the reference current before snapback of the target memory cell and higher than the reference current after snapback of the target memory cell. In this manner, an output of the sense amplifier/comparator may be indicative of a state of the target memory cell. A latch may be coupled to the output of the comparator to store the output of the read operation.

For each matrix of arrays, there may be a number of sense amplifiers provided, with the sense circuitry 222 able to process up to a maximum number of sensed bits, such as 128 bits, from the sense amplifiers at one time. Hence, 128 memory cells may be sensed at one time by sense amplifiers of the sense circuitry 222.

Figure 3:
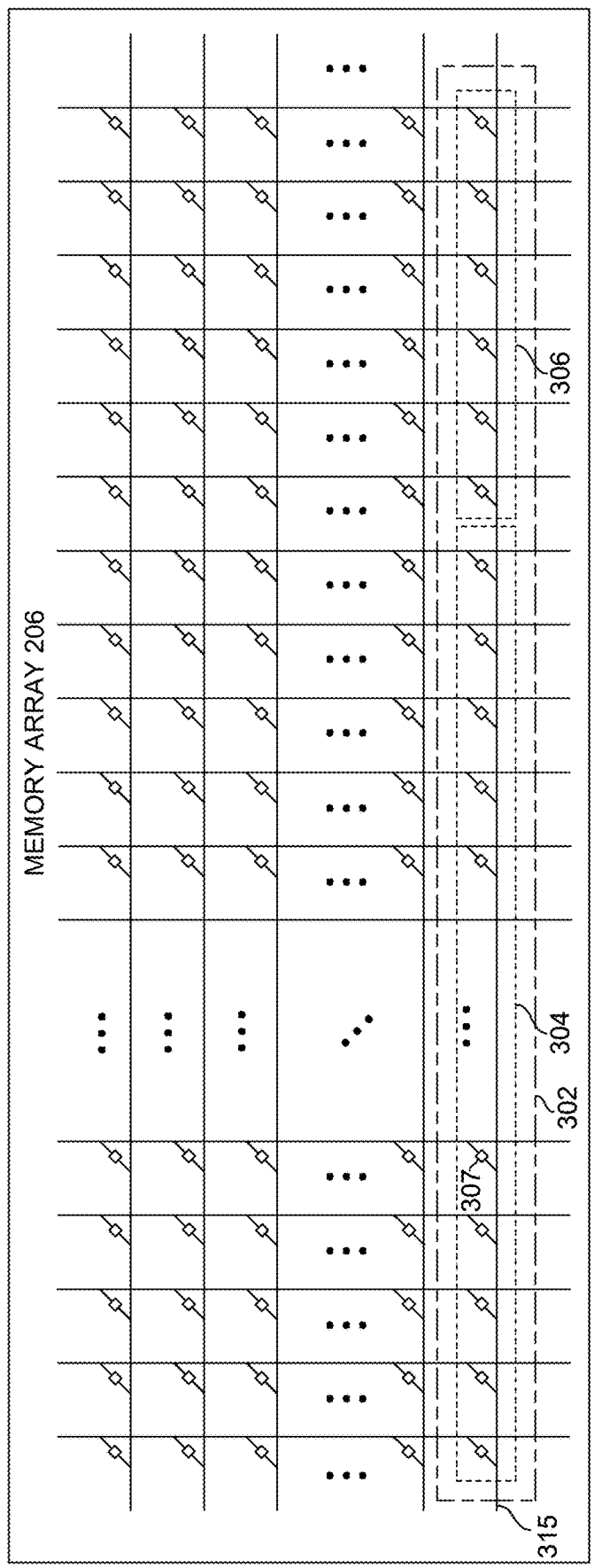
FIG. 3 is a schematic illustration of a memory array in accordance with certain embodiments.

FIG. 3 illustrates a detailed exemplary view of the memory array 206 of FIG. 2 in accordance with certain embodiments. In various embodiments, a plurality of memory cells 307 of memory array 206 may be divided into a logical group such as a slice 302 (and the memory array 206 may include a plurality of slices). In the embodiment depicted, slice 302 includes a plurality of memory cells 307 coupled to the same WL 315, though a slice 302 may comprise any suitable arrangement of memory cells.

In a particular embodiment, a slice may include a payload portion 304 and a metadata portion 306. The memory cells of the payload portion 304 may store data written to the storage device 106 by a host (e.g., CPU 102/104). For example, the host may send a write command specifying payload data to be written to the storage device 106 at a particular logical address. The payload of the write command may be stored in a payload portion 304 of one or more slices 302 (in various embodiments, the payload portion 304 may be large enough to hold payload data from multiple write commands from the host). In various embodiments, the size of the payload portion of a slice may have any suitable size, such as 1 kibibyte (KiB), 2 KiB, 4 KiB, 8 KiB, or other suitable size.

The memory cells of the metadata portion 306 of a slice 302 may store metadata associated with the payload data stored in the payload portion 304 of the slice 302 or the slice itself. The metadata portion 306 may store any suitable metadata associated with the payload data or slice. For example, the metadata portion 306 may store parity bits and/or cyclic redundancy check (CRC) bits used during error detection and error correction, e.g., by the storage device controller 118. In alternative embodiments, error detection and/or correction may be performed at any suitable level on the storage device 106, such as by the chip controllers 126 or partition controllers.

Figure 4:
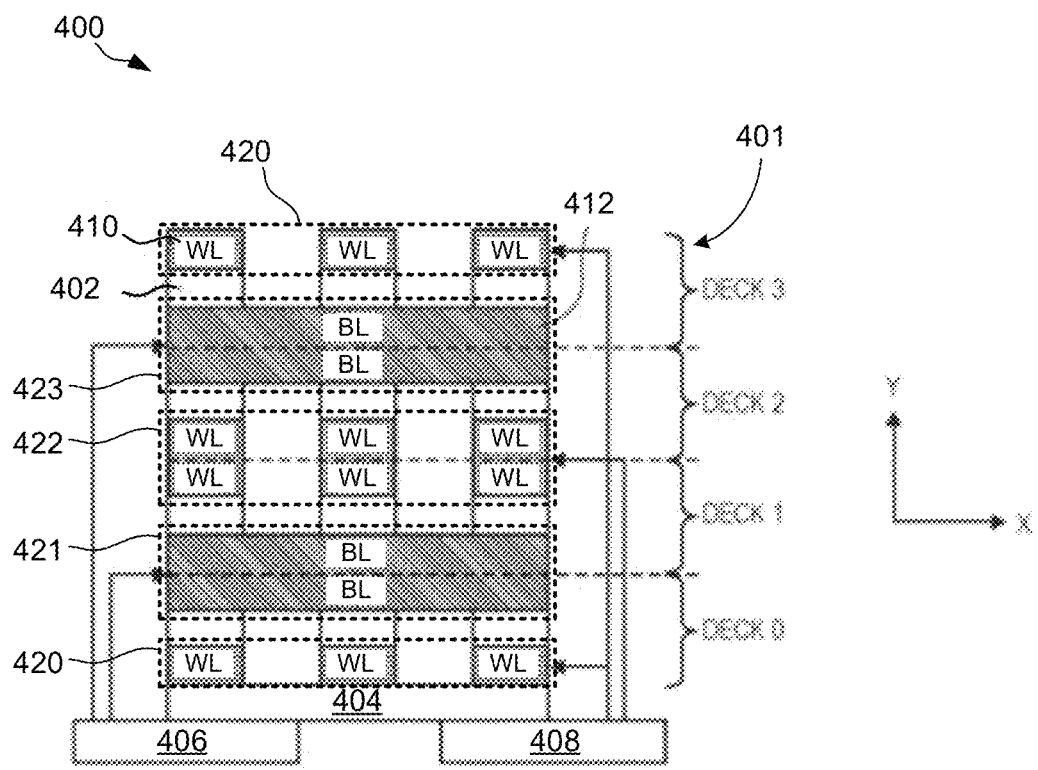
FIG. 4 is a is a block diagram of an example of a multi-deck non-volatile memory device according to some embodiments.

FIG. 4 is a block diagram of an example of a multi-deck non-volatile memory device 400 according to some embodiments. As illustrated, the multi-deck non-volatile memory device 400 may include a plurality of decks 401 (e.g., Deck 0, Deck 1, Deck 2, and Deck 3, or the like).

In some implementations, each of the decks 401 may include an array of memory cells 402 with conductive access lines (e.g., wordlines 410 and bitlines 412). For example, the memory cells 402 may include a material capable of being in two or more stable states to store a logic value. In one example, the memory cells 402 may include a phase change material, a chalcogenide material, the like, or combinations thereof. However, any suitable storage material may be utilized. The wordlines 410 and bitlines 412 may be patterned so that the wordlines 410 are orthogonal to the bitlines 412, creating a grid pattern or "cross-points." A cross-point may refer to an intersection between a bitline, a wordline, and active material(s) (e.g., a selector (select device (SD) region) and/or a storage material (e.g., phase change material (PM) region)). A memory cell 402 may be located at the intersection of a wordline 410 and a bitline 412. Accordingly, one or more of the decks 401 may include a crosspoint array of non-volatile memory cells, where each of the memory cells may include a material capable of being in two or more stable states to store a logic value.

As illustrated, an electrically isolating material 404 may separate the conductive access lines (e.g., wordlines 410 and bitlines 412) of the bottom deck (e.g., deck 0) from bitline sockets 406 and wordline sockets 408. For example, the memory cells 402 may be coupled with access and control circuitry for operation of the three-dimensional memory device 400 via the bitline sockets 406 and the wordline sockets 408.

Further, as illustrated, the bitlines and wordlines are organized in layers, with each layer being split between decks. In particular, there are two bitline layers 421, 423 and two wordline layers 420, 422. As shown, the wordline layer 420 is split between decks 0 and 3 as two conductors activated by a first signal from socket 408, while the wordline layer 422 is one conductor material that is split between decks 1 and 2 and activated by a second signal from socket 408. The bitline layer 421 includes one conductor material that is activated with a first signal by the socket 406, and the bitline layer 423 includes one conductor material that is activated with a second signal by the socket 406. The bitline layer 421 is split between decks 0 and 1 (with the activation of a memory cell in deck 0 or 1 being dictated by activation of wordline layer 420 or 422, respectively), while the bitline layer 423 is split between decks 2 and 3 (with the activation of a memory cell in deck 2 or 3 being dictated by activation of wordline layer 422 or 420, respectively). Since the wordline layer 420 is routed in 2 different vertical locations, it is only a 1× thickness in each location, while wordline layer 422 connects to 2× the number of memory cells as each wordline layer 420 bus and is accordingly routed at a 2× thickness so that the RCs of wordline layer 422 matches the RC of each bus of wordline layer 420. Further, the bitline layers 421, 423 are also routed at 2× thickness to match the RCs of the bitlines to the wordlines.

The crosspoint memory array of FIG. 4 is one example of multi-deck non-volatile memory device 400, however, the techniques described herein may not be limited to crosspoint memory, but any memory device with multiple layers or decks of memory cells. Thus, memory systems may be designed to have one or more packages, each of which may include one or more memory dies, and each memory die may include multiple partitions and multiple decks.

Figure 5:
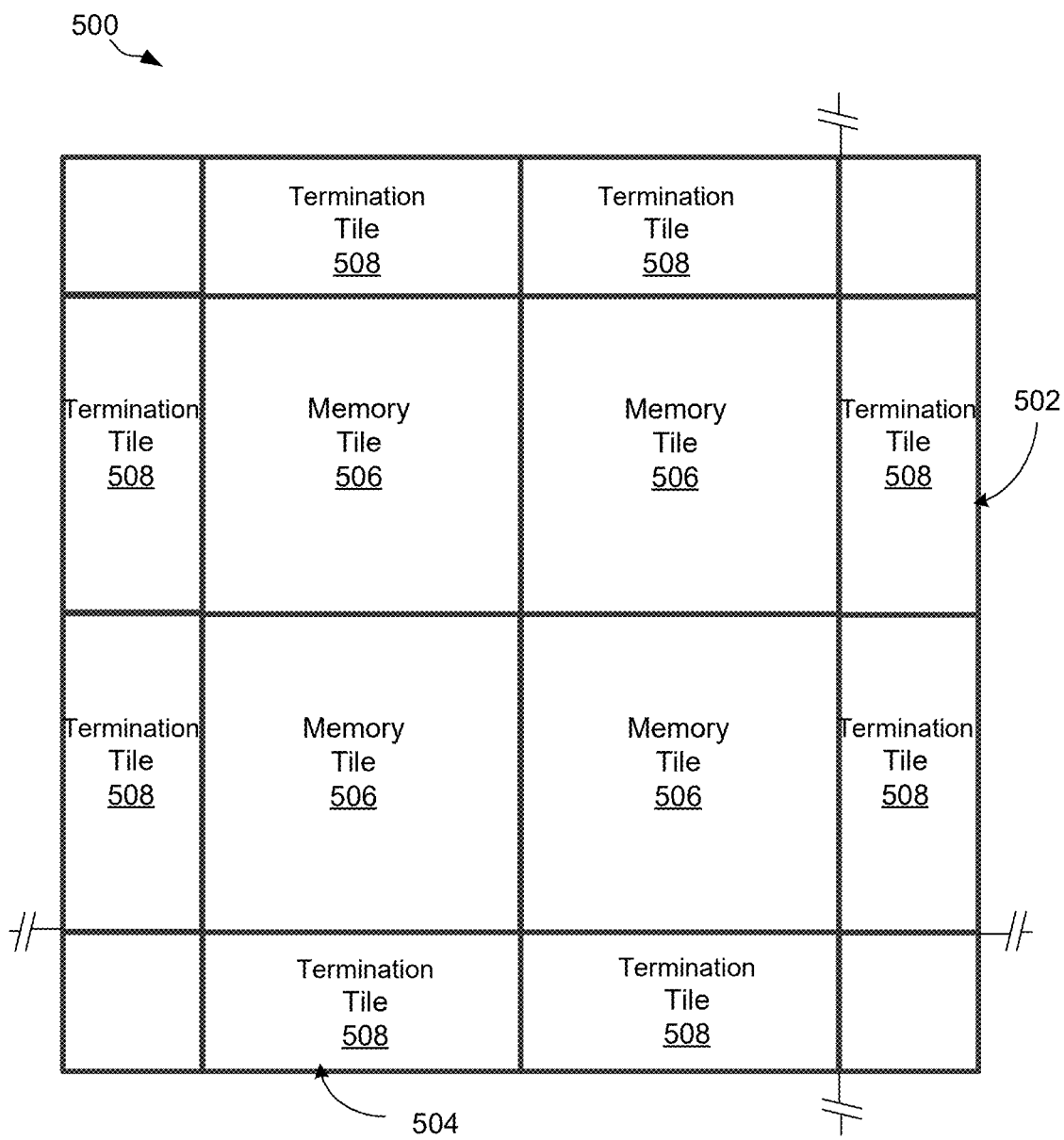
FIG. 5 is an illustration of an example of a memory partition according to some embodiments.

FIG. 5 is an illustration of an example of a memory partition 500 according to some embodiments. As illustrated, the memory partition 500 may be included as part of one or more decks (e.g., see FIG. 4). For example, the memory partition 500 may include a plurality of memory tile rows 502 and a plurality of memory tile columns 504.

The plurality of memory tile rows 502 and a plurality of memory tile columns 504 may be formed of a plurality of memory tiles 506. For example, the memory partition 500 may be a 128 tile partition. In such an example, the memory partition 500 may be sized to include 8 memory tiles 506 in a first dimension and 16 memory tiles 506 in another dimension, resulting in a 128 tile partition.

In some implementations, a plurality of termination tiles 508 may be located at either end of the plurality of memory tile rows 502 and either end of the plurality of memory tile columns 504. As used herein the term "termination tile" refers to tiles at the outer edges of an array of tiles in the partition 500. For example, memory tiles 506 near the edges of the partition 500 may have either wordlines and/or bitlines that are not driven. Accordingly, termination tiles 508 may be added around these memory tiles 506 near the edges of the partition 500 to provide access to these un-selectable memory cells. Wordline decoders and/or bitline decoders (e.g., wordline decoders 702 and 704 and bitline decoders 706 and 708, as will be discussed in further detail below in FIG. 7A) in the termination tiles 508 may enable the accesses to these un-selectable memory cells.

Figure 6:
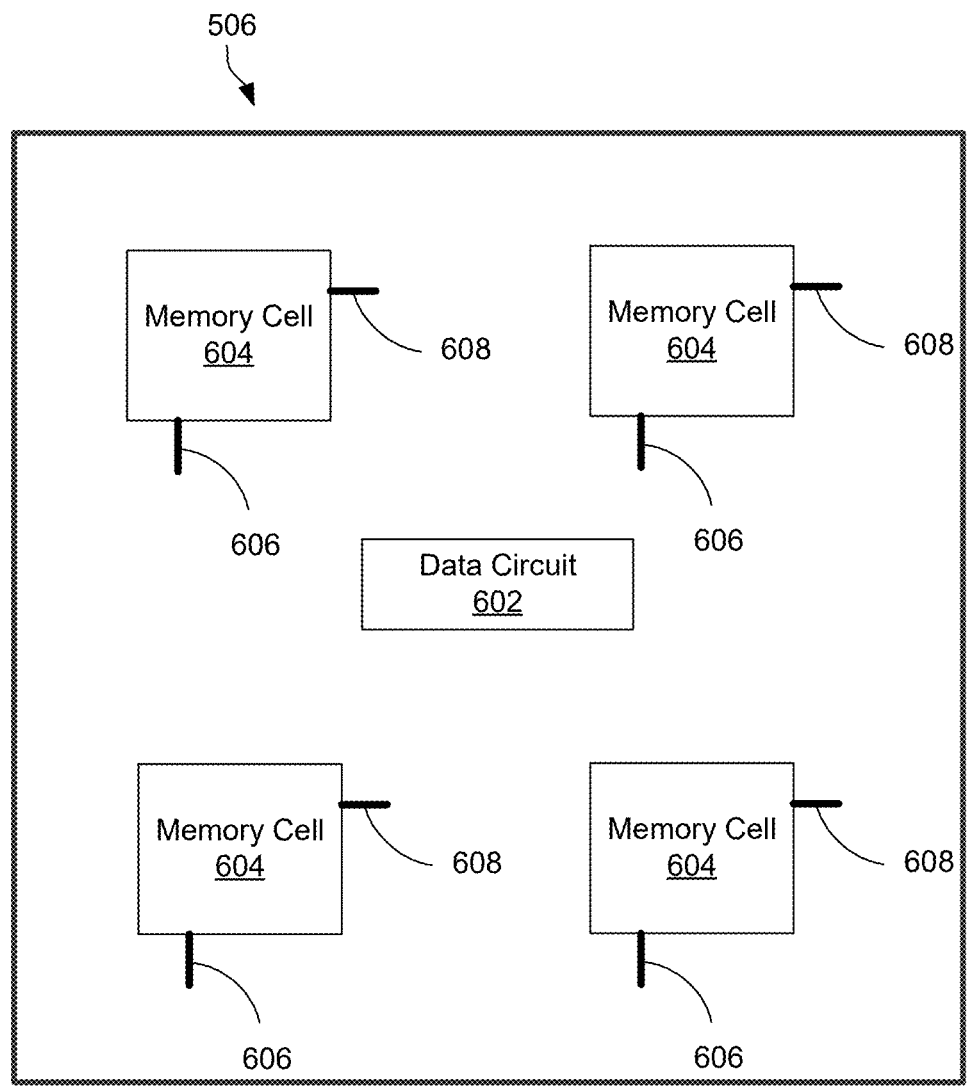
FIG. 6 is an illustration of an example of a memory tile according to some embodiments.

FIG. 6 is an illustration of an example of the memory tile 506 according to some embodiments. As illustrated, the memory tile 506 may include a data circuit 602 coupled to a plurality of memory cells 604. In some implementations, the data circuit 602 may provide access to a data state of the memory cells 604. For example, the data circuit 602 may provide write data to wordline drivers and bitline drivers (see, e.g., wordline drivers 804 and bitline drivers 808 of FIG. 8, as will be discussed in further detail below). The data circuit 602 may also send read data from the bitline drivers to the wordline drivers and send read data to data output circuitry. In some implementations, the memory cells 604 may be accessed via a plurality of wordlines 606 and bitlines 608. For example, each of the memory cells 604 may be located at an intersection of one of wordlines 606 and one of the bitlines 608.

Figure 7A:
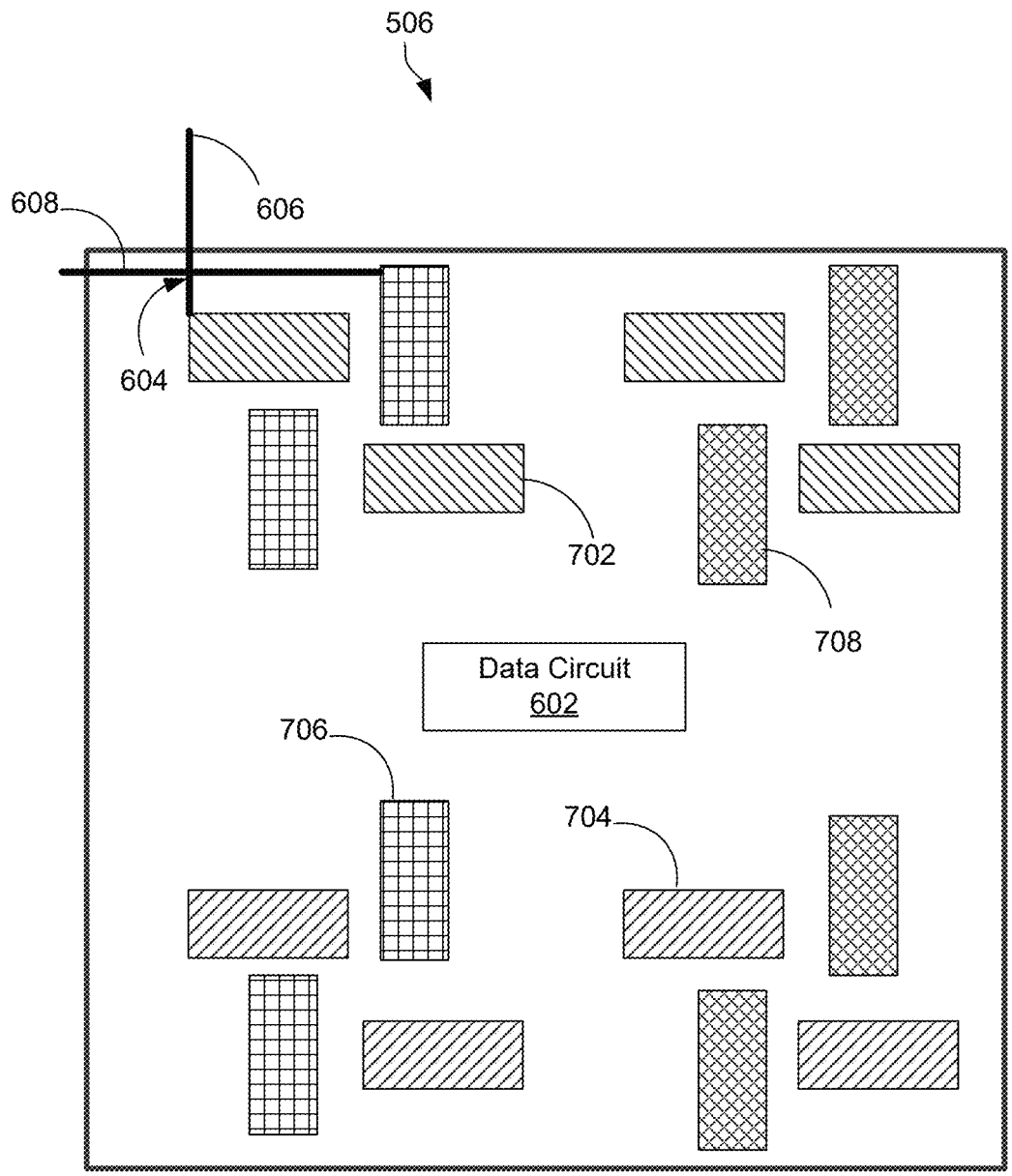
FIG. 7A is another illustration of an example of a memory tile according to some embodiments.

FIG. 7A is another illustration of an example of the memory tile 506 according to some embodiments. As illustrated, the memory tile 506 may include several decoders, such as a first set of wordline decoders 702, a second set of wordline decoders 704, a first set of bitline decoders 706, and a second set of bitline decoders 708. For example, the various sets of decoders 702, 704, 706, and 708 may be interwoven through the various decks. In the illustrated example, the first set of wordline decoders 702 may be connected to deck 1 and deck 2, the second set of wordline decoders 704 may be connected to deck 0 and deck 3, the first set of bitline decoders 706 may be connected to deck 2 and deck 3, and the second set of bitline decoders 708 may be connected to deck 0 and deck 1, although other configurations may be possible.

In some implementations, the memory cells 604 may be accessed via a plurality of wordlines 606 and a plurality of bitlines 608. For example, each of the memory cells 604 may be located at an intersection of one of wordlines 606 and one of the bitlines 608. In some implementations, activation of a specific pair of wordline and bitline decoders from the sets of decoders 702, 704, 706, and 708 may be used to access one memory cell 604, via the wordlines 606 and the bitlines 608.

Figure 8:
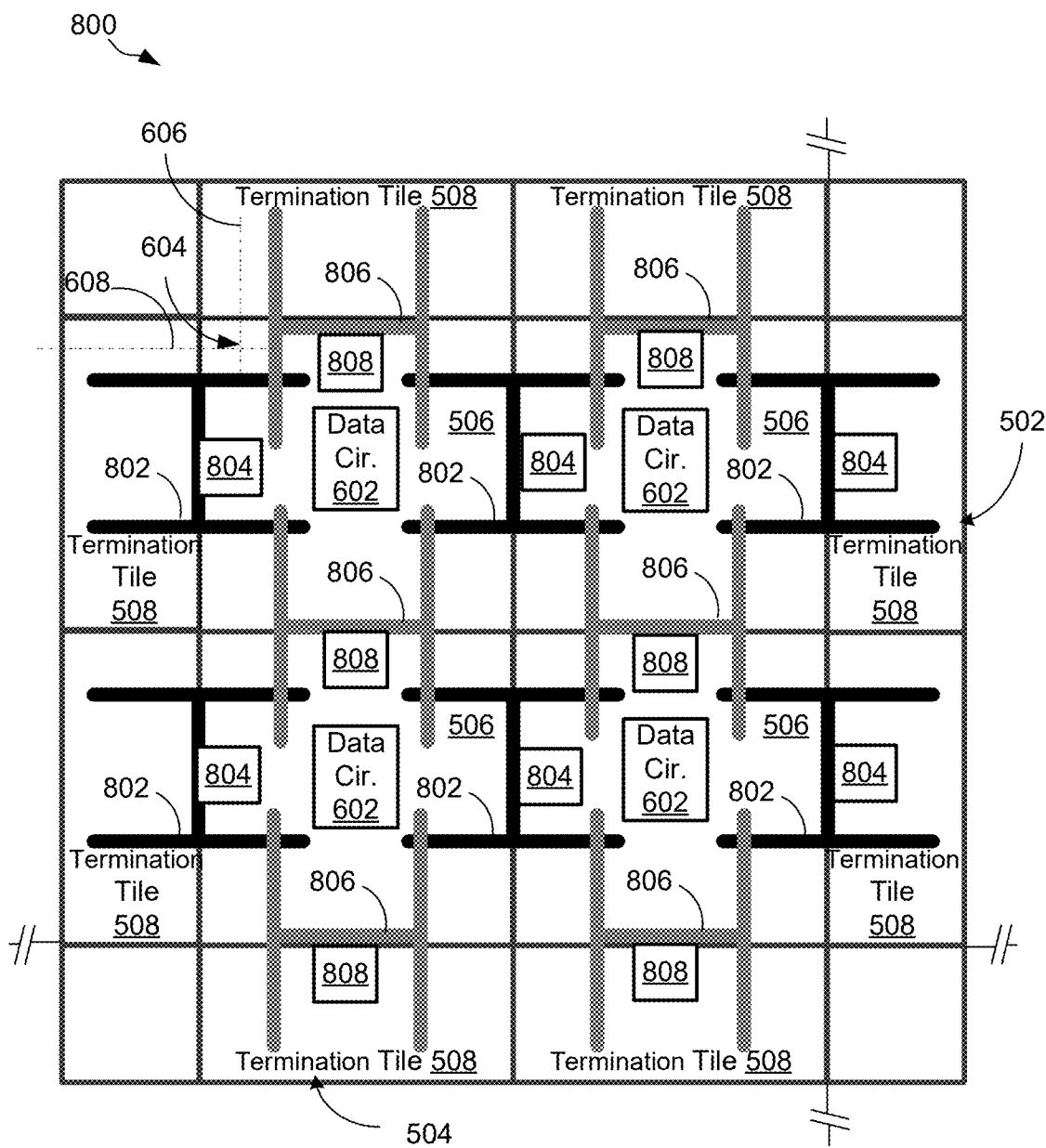
FIG. 8 is a block diagram of an example of a multi-deck non-volatile memory architecture with a wordline bus and bitline bus configuration according to some embodiments.

FIG. 8 is a block diagram of an example of a wordline bus and bitline bus configuration 800 according to some embodiments. As illustrated, the improved wordline bus and bitline bus configuration 800 may include a plurality of wordline buses 802 coupled to corresponding wordline drivers 804. Similarly, the improved wordline bus and bitline bus configuration 800 may include a plurality of bitline buses 806 coupled to corresponding bitline drivers 808.

In some implementations, at least some of the wordline buses 802 may be located over one of the termination tiles 508 (e.g., one of the termination tiles 508 located at one end of one of the memory tile rows 502) and located over at least a portion of one of the memory tiles 506. Similarly, at least some of the bitline buses 806 may be located over another one of the termination tiles 508 (e.g., one of the termination tiles 508 located at one end of one of the memory tile columns 504) and located over at least a portion of one of the memory tiles 506.

Additionally or alternatively, at least some of the wordline buses 802 may be located over at least a portion of two adjacent memory tiles 506. Similarly, at least some of the bitline buses 806 may be located over at least a portion of two adjacent memory tiles 506. In such implementations, a single one of the memory tiles 506 may be coupled to at least a portion of two of wordline buses 802 and two of the bitline buses 806.

Figure 7B:
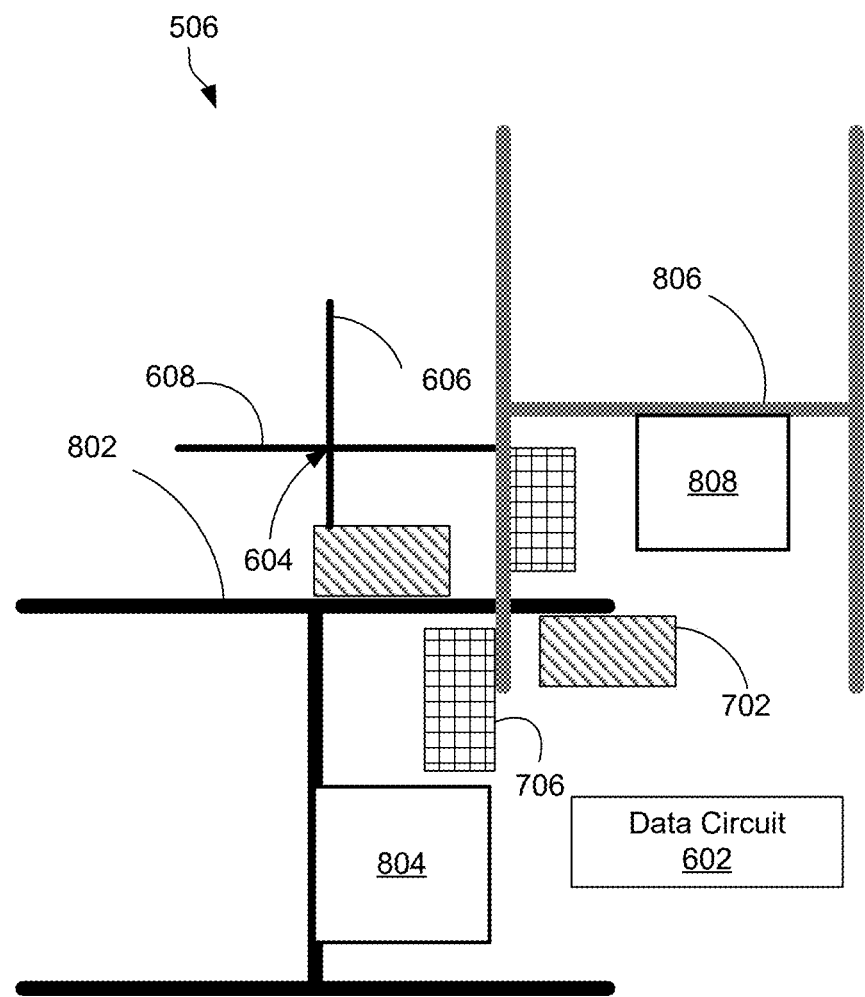
FIG. 7B is still another illustration of an example of a memory tile according to some embodiments.

FIG. 7B is still another illustration of an example of the memory tile 506 according to some embodiments. In the illustrated example, each of the wordline drivers 804 are each associated with a number of the wordline decoders 702. Similarly, each of the bitline drivers 808 are each associated with a number of the bitline decoders 706. In some examples, each of wordline drivers 804 may be coupled to a corresponding one of the wordline buses 802. The wordline bus 802 may be coupled to a group of wordline decoders 702 and may allow the wordline driver 804 to connect to a first group of wordline decoders 702 (e.g., as well as to connect to a second group of wordline decoders 704, as illustrated in FIG. 7A). For example, each of wordline drivers 804 may drive access to at least a portion of the wordlines 606 via the wordline decoder bus 802 and via the wordline decoders 702 (e.g., as well as via a second group of wordline decoders 704, as illustrated in FIG. 7A). Similarly, each of bitline drivers 808 may drive access to at least a portion of the bitlines 608 via the bitline decoder bus 806 and via the bitline decoders 706 (e.g., as well as via a second group of bitline decoders 708, as illustrated in FIG. 7A). In some implementations, the memory cells 604 may be accessed via the wordlines 606 and bitlines 608. For example, each of the memory cells 604 may be located at an intersection of one of wordlines 606 and one of the bitlines 608. In some implementations, activation of a specific pair of wordline and bitline decoders from the sets of decoders 702 and 706 may be used to access one memory cell 604, via the wordlines 606 and the bitlines 608.

Referring back to FIG. 8, each of the wordline drivers 804 may be each associated with an identical number of the wordline decoders even when comparing one of the wordline drivers located over two adjacent memory tiles 506 to a different one of the wordline drivers located over one of the termination tiles 508 and one of the memory tiles 506. However, in some implementations there may not always be an identical number of decoders cells when comparing one of the wordline drivers located over two adjacent memory tiles 506 to a different one of the wordline drivers located over one of the termination tiles 508 and one of the memory tiles 506.

Figure 9:
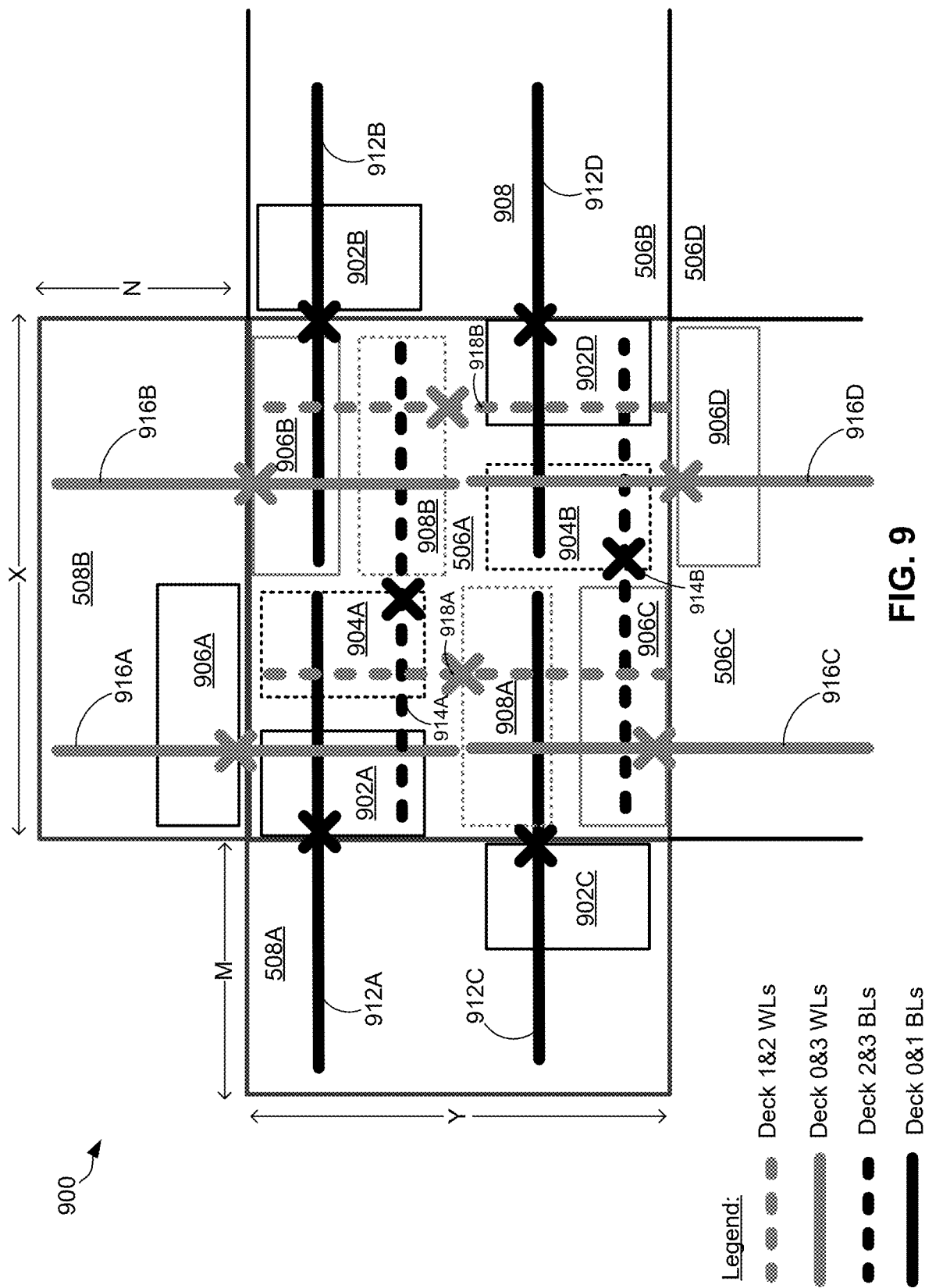
FIG. 9 is an illustration of an example memory tile adjacent to termination tiles in a partition according to some embodiments.

FIG. 9 is an illustration of an example memory tile 506A adjacent to termination tiles 508 in a partition 900 according to some embodiments. In the example shown, the memory tile 506A includes 4 decks of memory cells (deck 0, deck 1, deck 2, and deck 3). The memory tile 506A includes bitlines 912, 914 and wordlines 916, 918 to access memory cells within the tile 506A in the decks at the intersections of the bitlines and wordlines as described above. The bitlines 912 represent bitlines for decks 0 and 1, while the bitlines 914 represent bitlines for decks 2 and 3. Although the bitlines and wordlines are shown as single lines in FIG. 9, it will be understood that the memory tile 506A may include a number Y bitlines and X wordlines. For example, some embodiments may include a total number of Y=2048 bitlines (e.g., with 1024 bitlines 912A/912B and 1024 bitlines 912C/912D) and a total number of X=4096 wordlines (e.g., with 2048 wordlines 916A/916C and 2048 wordlines 916B/916D) across the memory tile 506A. Other embodiments may include other numbers of bitlines and wordlines (e.g., Y=2048 bitlines and X=2048 wordlines or Y=4096 bitlines and X=4096 wordlines or Y=4096 bitlines and X=2048 wordlines).

In the example shown, the bitlines and wordlines of the tile 506A are driven by decoders within the tile 506A or within adjacent tiles. For instance, the bitlines 912A are driven by the decoder 902A, the bitlines 912B are driven by the decoder 902B, the bitlines 912C are driven by the decoder 902C, the bitlines 912D are driven by the decoder 902D, the bitlines 914A are driven by the decoder 904A, and the bitlines 914B are driven by the decoder 904B. Further, the wordlines 916A are driven by the decoder 906A, the wordlines 916B are driven by the decoder 906B, the wordlines 916C are driven by the decoder 906C, the wordlines 916D are driven by the decoder 906D, the wordlines 918A are driven by the decoder 908A, and the wordlines 918B are driven by the decoder 908B.

As indicated by the crosses in FIG. 9 (i.e., the "Xs" in FIG. 9), the deck 2&3 bitlines 914A, 914B are driven from the middle of tile 506A outward toward opposite edges of the tile 506A (i.e., toward a first edge of tile 506A bordering with termination tile 508A and toward a second edge of the tile 506A bordering with the tile 506B), while the deck 0&1 bitlines 912A, 912B, 912C, 912D are driven from the edge of the tile 506A halfway into the tile 506A (and halfway into the adjacent tile). Likewise, the deck 1&2 wordlines 918A, 918B are driven from the middle of tile 506A outward toward opposite edges of the tile 506A (i.e., toward a first edge of tile 506A bordering with termination tile 508B and toward a second edge of the tile 506A bordering with the tile 506C), while the deck 0&3 wordlines 916A, 916B, 916C, 916D are driven from the edge of the tile 506A halfway into the tile 506A (and halfway into the adjacent tile). That is, the bitlines may be driven across a length, in each direction, equal to X/2 and the wordlines may be driven across a length, in each direction, equal to Y/2. As used herein, the dimensions, X, Y may refer to a number of access lines and also a number memory cells (as memory cells are formed at the intersection of the access lines).

In typical wordline/bitline bus configurations, the data circuits (e.g., 602) may write and read the data state only via buses limited to an adjacent set of two of the wordline buses 802 and two of the bitline buses 806. As such, the data circuits may be required to perform a "shift" to perform reads or writes to cells within the set of memory tiles 506 of a partition. The shifting may involve the activation of circuitry within an adjacent tile to activate a wordline or bitline that is split between two tiles (e.g., as shown in FIGS. 8-9). This shifting requires the use of certain driver circuitry within the termination tile areas.

For instance, referring to FIG. 9, if one of bitlines 912C is to be activated, e.g., for a write operation, within the main tile 506A, a data circuit (e.g., 602) of the main tile 506A would need to "shift left" and transfer the data and/or other information to a data circuit or other circuitry within the termination tile 508A so that the decoder circuit 902C can be activated (e.g., driven by driver circuitry) to activate the bitline 912C. Likewise, if one of wordlines 916A is to be activated within the main tile 506A, the data and/or other information would need to "shift up" and be transferred to a data circuit or other circuitry within the termination tile 508B so that the decoder circuit 906A can be activated (e.g., driven by driver circuitry) to activate the wordline 916A.

However, embodiments of the present disclosure may include circuitry that allows for the removal of the driver circuitry within the termination tile areas of a memory device as described herein. For example, some embodiments may incorporate multiplexing circuitry in one or both of the wordline or bitline control paths that allows the driver circuitry to be placed solely within the main tiles of a memory partition (e.g., 506). As an example, in a 128-tile partition, aspects herein may reduce the number of bitline driver circuits from 160 to 128 and the number of wordline driver circuits from 144 to 128. The multiplexing circuitry thus eliminates the need to shift the wordline or bitline control signals into other main or termination tiles as in current designs, allowing for other partition circuitry to be moved into the termination tile area that used to contain the driver circuitry and thus, enabling a smaller die size for the memory partition (e.g., by approximately 3.6%). Further, certain embodiments herein may also improve the latency performance of a memory partition, since the shifting of user and/or mask data is eliminated. Shifting circuitry in a partition may be reduced from having eight different shifting cases, for example, to no shifting cases. Moreover, embodiments herein may remove the need of masking and/or decode driver circuitry in one or both of the wordline and bitline paths, which can significantly lower the idle energy (e.g., by approximately 16%). Additionally, because the partition circuit design is simplified, fewer use cases need to be simulated in the design of the partition.

Figure 10:
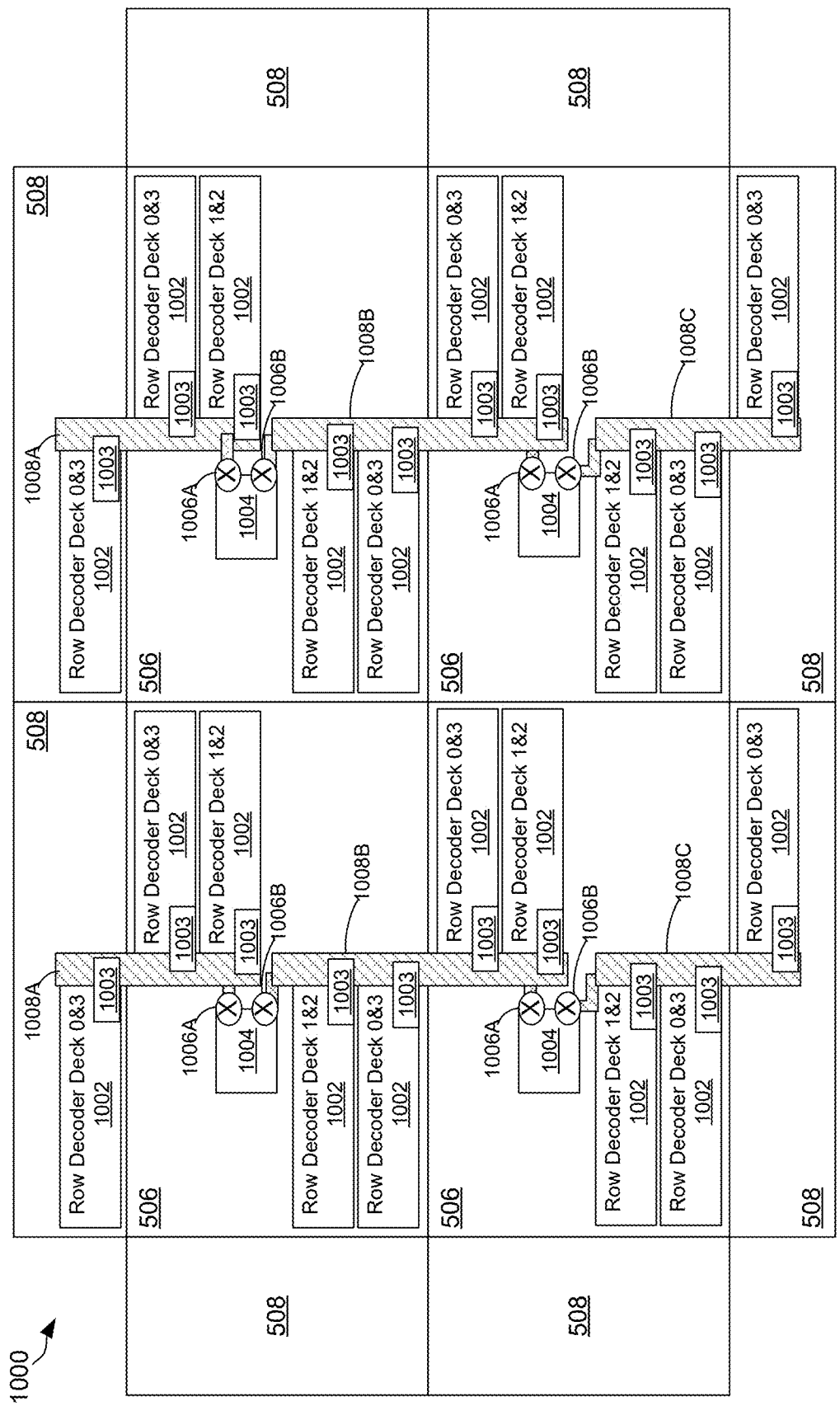
FIG. 10 illustrates a block diagram of an example wordline driver circuitry configuration according to some embodiments.

FIG. 10 illustrates a block diagram of an example wordline driver circuitry configuration according to some embodiments. In the example shown, a memory partition 1000 includes 4 main tiles 506 and 8 termination tiles 508, similar to the configuration shown in FIG. 8. However, it will be understood that aspects of the present disclosure may be applied to larger memory partitions, e.g., those with 128 or more main tiles 508 (e.g., 8 row, 16 column configurations).

As shown, each main tile 506 includes row decoder circuitry 1002 for the wordlines on the various decks of the partition. The decoders 1002 may be implemented similar to the wordlines decoders described above, e.g., with respect to FIG. 9. Each row decoder circuit 1002 is attached to a wordline voltage bus 1008. In the example shown, there are three separate wordline voltage buses 1008 per column, with the top 3 decoder circuits 1002 in each column being connected to a first wordline voltage bus 1008A, the middle four decoder circuits 1002 in each column being connected to a second wordline voltage bus 1008B, and the bottom three decoder circuits 1002 in each column being connected to a third wordline voltage bus 1008C. Each row decoder circuit 1002 includes a selector circuit 1003 that selects whether the decoder circuit 1002 is to be attached to the wordline voltage bus 1008 to which it is connected.

Each main tile 506 includes a wordline driver circuit 1004, which may be a current or voltage driver circuit in certain embodiments. Each wordline driver circuit 1004 is connected to the two wordline voltage buses 1008 that are within the main tile 506, via multiplexer circuitry 1006. For instance, the wordline driver circuits 1004 of the top row are connected to the wordline voltage buses 1008A, 1008B and the wordline driver circuits 1004 of the bottom row are connected to the wordline voltage buses 1008B, 1008C. The multiplexer circuitry 1006 allows the wordline driver circuits 1004 to be connected to one of its two wordline voltage buses 1008 at a time. For example, the wordline driver circuit 1004 of the top left main tile 506 may be connected to either wordline voltage bus 1008A or 1008B, but not to both at the simultaneously. If the wordline driver circuit 1004 of the top left main tile 506 is connected to wordline voltage bus 1008A via 1006A, then the wordline driver circuit 1004 of the bottom left main tile 506 is connected to wordline voltage bus 1008B via 1006A. Conversely, if the wordline driver circuit 1004 of the top left main tile 506 is connected to wordline voltage bus 1008B via 1006B, then the wordline driver circuit 1004 of the bottom left main tile 506 is connected to wordline voltage bus 1008C via 1006B.

In contrast to the configuration shown in FIG. 10, in current systems, the column termination tiles 508 may also include driver circuits similar to 1004 as described above for use in shifting. This adds to the overall driver circuitry needed for a partition. For example, in a partition with 128 main tiles in an 8 row, 16 column configuration, 160 driver circuits may be needed. Further, various shifting circuitry is needed to allow for the data shifts to occur as described above. However, by using the configuration shown in FIG. 10, the number of driver circuits 1004 for use in driving wordlines is reduced to the number of main tiles, i.e., the same 128 tile partition will include only 128 driver circuits 1004. For instance, if a wordline is to be activated within the upper left quadrant of the upper left main tile, instead of shifting up as described above, the multiplexer circuitry 1006A may be activated to drive the row decoder in the upper left termination tile. Likewise, if a wordline is to be activated within the lower right quadrant of the upper left main tile, instead of shifting down, the multiplexer circuitry 1006B may be activated to drive the upper most row decoder in the bottom left termination tile.

Figure 11:
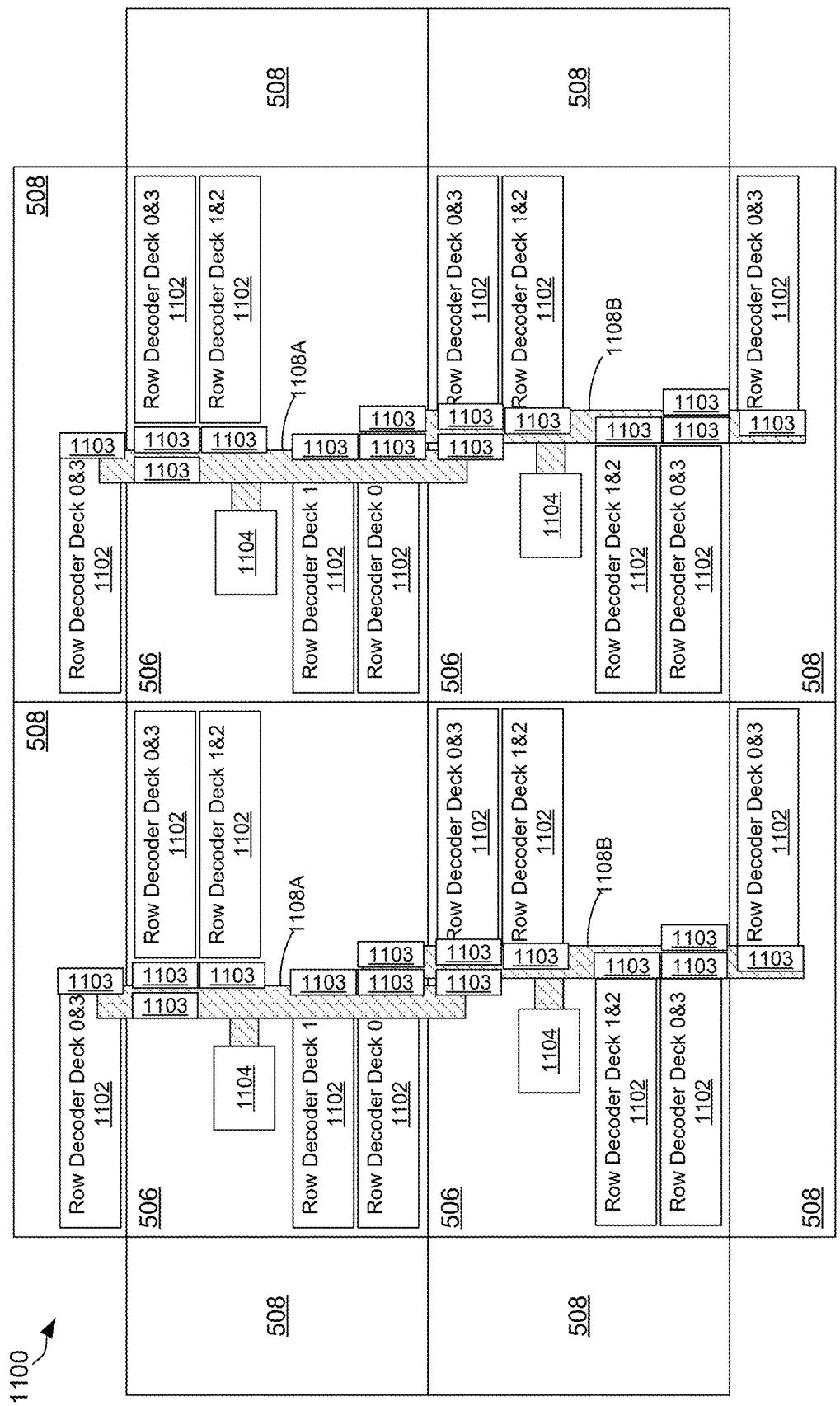
FIG. 11 illustrates a block diagram of another example wordline driver circuitry configuration according to some embodiments.

FIG. 11 illustrates a block diagram of another example wordline driver circuitry configuration according to some embodiments. In the example shown, a memory partition 1100 includes 4 main tiles 506 and 8 termination tiles 508, similar to the configuration shown in FIGS. 8 and 10. However, it will be understood that aspects of the present disclosure may be applied to larger memory partitions, e.g., those with 128 or more main tiles 506 (e.g., 8 row, 16 column configurations).

As shown, each main tile 506 includes row decoder circuitry 1102 for the wordlines on the various decks of the partition. The decoders 1102 may be implemented similar to the wordline decoders described above, e.g., with respect to FIGS. 9-10. Each row decoder circuit 1102 is attached to a wordline voltage bus 1108. In the example shown, and in contrast to the example shown in FIG. 10, there are two separate wordline voltage buses 1108A, 1108B per column. Each wordline voltage bus 1108 traverses an entire main tile 506 and extends into an adjacent tile (termination tile or main tile). For instance, as shown, the wordline voltage bus 1108A traverses the entire top main tiles 506 of each column and extends into the top termination tiles 508 and into the bottom main tiles 506, such that the wordline voltage bus 1108A connects to one decoder circuit 1102 in the neighboring tiles. Likewise, the wordline voltage bus 1108B traverses the entire bottom main tiles 506 of each column and extends into the top main tiles 506 and into the bottom termination tiles 508, such that the wordline voltage bus 1108B connects to one decoder circuit 1102 in the neighboring tiles. Each row decoder circuit 1102 includes a selector circuit 1103 that selects which decoder circuit 1102 is to be attached to the wordline voltage bus 1108 to which it is connected.

Each main tile 506 includes a wordline driver circuit 1104 (as in the example shown in FIG. 10), which may be a current or voltage driver circuit in certain embodiments. Each wordline driver circuit 1104 is connected to the wordline voltage bus 1108 that is within the same main tile 506. For instance, the wordline driver circuits 1104 of the top row are connected to the wordline voltage buses 1108A and the wordline driver circuits 1104 of the bottom row are connected to the wordline voltage buses 1108B. Each row decoder circuit 1102 includes at least one selector circuit 1103 that selects whether the decoder circuit 1102 is to be attached to the wordline voltage bus 1108 to which it is connected. In particular, the decoder circuits 1102 that are adjacent tiles above and below the main tile in which they are located (i.e., those that are connected to wordlines that extend into each of the two adjacent tiles as described with respect to FIG. 9) include two selector circuits 1103, allowing the driver circuits 1104 in each main tile to drive the decoder circuit 1102 in an adjacent tile to activate wordlines in the same main tile as the driver circuit 1104, preventing the need to "shift" data to the adjacent tile.

For instance, the bottom most decoder circuit 1102 of the top left main tile 506 has a first selector circuit 1103 that is connected to the wordline voltage bus 1108A and a second selector circuit 1103 that is connected to the wordline voltage bus 1108B. Thus, if the driver circuit 1104 of the top left main tile 506 is to activate wordlines in its bottom left quadrant, the first selector circuit 1103 will be configured to connect the bottom most decoder circuit 1102 to the wordline voltage bus 1108A and the second selector circuit 1103 will be configured to not connect the bottom most decoder circuit 1102 to the wordline voltage bus 1108B. If, on the other hand, the driver circuit 1104 of the bottom left main tile 506 is to activate wordlines in its upper left quadrant, the first selector circuit 1103 will be configured to not connect the bottom most decoder circuit 1102 in the top left main tile 506 to the wordline voltage bus 1108A and the second selector circuit 1103 will be configured to connect the bottom most decoder circuit 1102 in the top left main tile 506 to the wordline voltage bus 1108B.

Though it is only being connected to one wordline voltage bus 1108A, the upper most decoder circuit 1102 of the top main tiles also includes two selector circuits since each main tile circuit may be designed the same as one another in certain embodiments, and the upper most decoder circuits 1102 of the bottom main tiles are to connect to two different wordline voltage buses.

Figure 12:
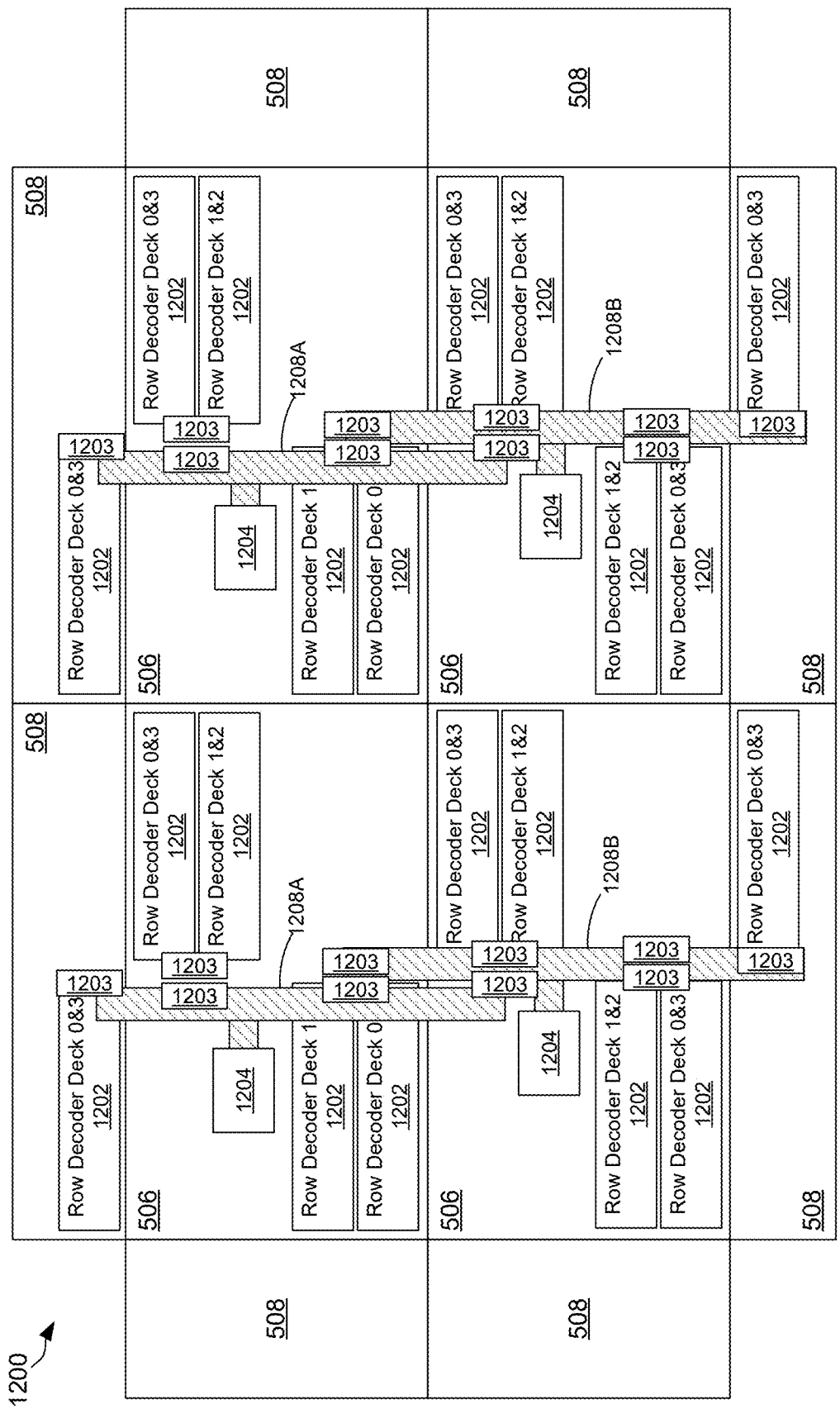
FIG. 12 illustrates a block diagram of yet another example wordline driver circuitry configuration according to some embodiments.

FIG. 12 illustrates a block diagram of yet another example wordline driver circuitry configuration according to some embodiments. The example shown in FIG. 12 is similar to that of the example shown in FIG. 11, except that the upper pair of decoder circuits 1202 in each tile share a first pair of selector circuits 1203 and the lower pair of decoder circuits 1202 in each tile share a second pair of selector circuits 1203. Each selector circuit 1203 of the second pair in the top row of main tiles is connected to a respective wordline voltage bus 1208A, 1208B, while each selector circuit 1203 of the first pair in the bottom row of main tiles is connected to a respective wordline voltage bus 1208A, 1208B. Though the decoder circuits adjacent to termination tiles are only connected to one wordline voltage bus, they still include a pair of selector circuits since each main tile circuit may be designed the same as one another in certain embodiments.

In each pair of shared selector circuits 1203, only one selector circuit 1203 can be activated at one time. Thus, if the driver circuit 1204 of the top left main tile 506 is to activate wordlines in its bottom left quadrant, a first selector circuit 1203 of the second pair will be configured to connect the bottom decoder circuits 1202 of the top left main tile to the wordline voltage bus 1208A and the second selector circuit 1203 of the second pair will be configured to not connect the bottom most decoder circuits 1202 to the wordline voltage bus 1108B. If, on the other hand, the driver circuit 1204 of the bottom left main tile 506 is to activate wordlines in its upper left quadrant, the first selector circuit 1203 of the second pair in the top left main tile will be configured to not connect the bottom most decoder circuits 1202 in the top left main tile 506 to the wordline voltage bus 1208A and the second selector circuit 1203 will be configured to connect the bottom most decoder circuit 1202 in the top left main tile 506 to the wordline voltage bus 1208B.

In the example shown in FIG. 12, the number of driver circuits 1204 is still reduced as in the previous examples, but the number of selector circuits is also unchanged from the example shown in FIG. 10 (whereas FIG. 11 includes two extra selector circuits 1103 per main tile compared with the example shown in FIG. 10).

Figure 13:
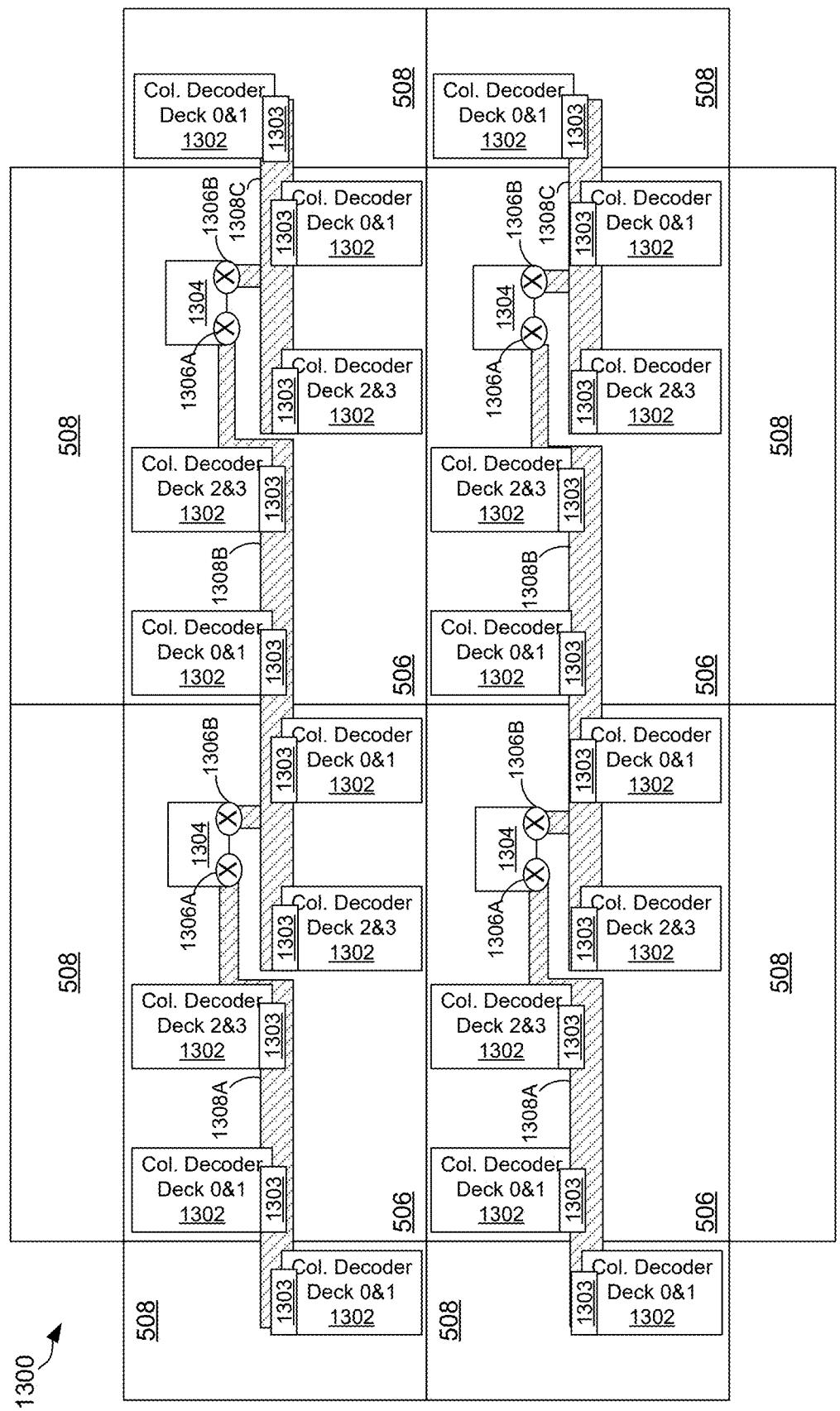
FIG. 13 illustrates a block diagram of an example bitline driver circuitry configuration according to some embodiments.

FIG. 13 illustrates a block diagram of an example bitline driver circuitry configuration according to some embodiments. In the example shown, a memory partition 1300 includes 4 main tiles 506 and 8 termination tiles 508, similar to the configuration shown in FIG. 8. However, it will be understood that aspects of the present disclosure may be applied to larger memory partitions, e.g., those with 128 or more main tiles 508 (e.g., 8 row, 16 column configurations).

As shown, each main tile 506 includes column decoder circuitry 1302 for the bitlines on the various decks of the partition. The decoders 1302 may be implemented similar to the bitline decoders described above, e.g., with respect to FIG. 9. Each column decoder circuit 1302 is attached to a bitline voltage bus 1308. In the example shown, there are three separate bitline voltage buses 1308 per row, with the left 3 decoder circuits 1302 in each column being connected to a first bitline voltage bus 1308A, the middle four decoder circuits 1302 in each row being connected to a second bitline voltage bus 1308B, and the right three decoder circuits 1302 in each column being connected to a third bitline voltage bus 1308C. Each column decoder circuit 1302 includes a selector circuit 1303 that selects which decoder circuit 1302 is to be attached to the bitline voltage bus 1308 to which it is connected.

Each main tile 506 includes a bitline driver circuit 1304, which may be a current or voltage driver circuit in certain embodiments. Each bitline driver circuit 1304 is connected to the two bitline voltage buses 1308 that are within the main tile 506, via multiplexer circuitry 1306. For instance, the bitline driver circuits 1304 of the left column are connected to the bitline voltage buses 1308A, 1308B and the bitline driver circuits 1304 of the right column are connected to the bitline voltage buses 1308B, 1308C. The multiplexer circuitry 1306 allows the bitline driver circuits 1304 to be connected to one of its two bitline voltage buses 1308 at a time. For example, the bitline driver circuit 1304 of the top left main tile 506 may be connected to either bitline voltage bus 1308A or 1308B, but not to both at the simultaneously. If the bitline driver circuit 1304 of the top left main tile 506 is connected to bitline voltage bus 1308A via 1306A, then the bitline driver circuit 1304 of the top right main tile 506 is connected to bitline voltage bus 1308B via 1306A. Conversely, if the bitline driver circuit 1304 of the top left main tile 506 is connected to bitline voltage bus 1308B via 1306B, then the bitline driver circuit 1304 of the top right main tile 506 is connected to bitline voltage bus 1308C via 1306B.

In contrast to the configuration shown in FIG. 13, in current systems, the row termination tiles 508 may also include driver circuits similar to 1304. For example, in a partition with 128 main tiles in an 8 row, 16 column configuration, 144 driver circuits may be needed along with various shifting circuitry. However, by using the configuration shown, the number of driver circuits 1304 is reduced to the number of main tiles, i.e., the same 128 tile partition will include only 128 driver circuits 1304.

Figure 14:
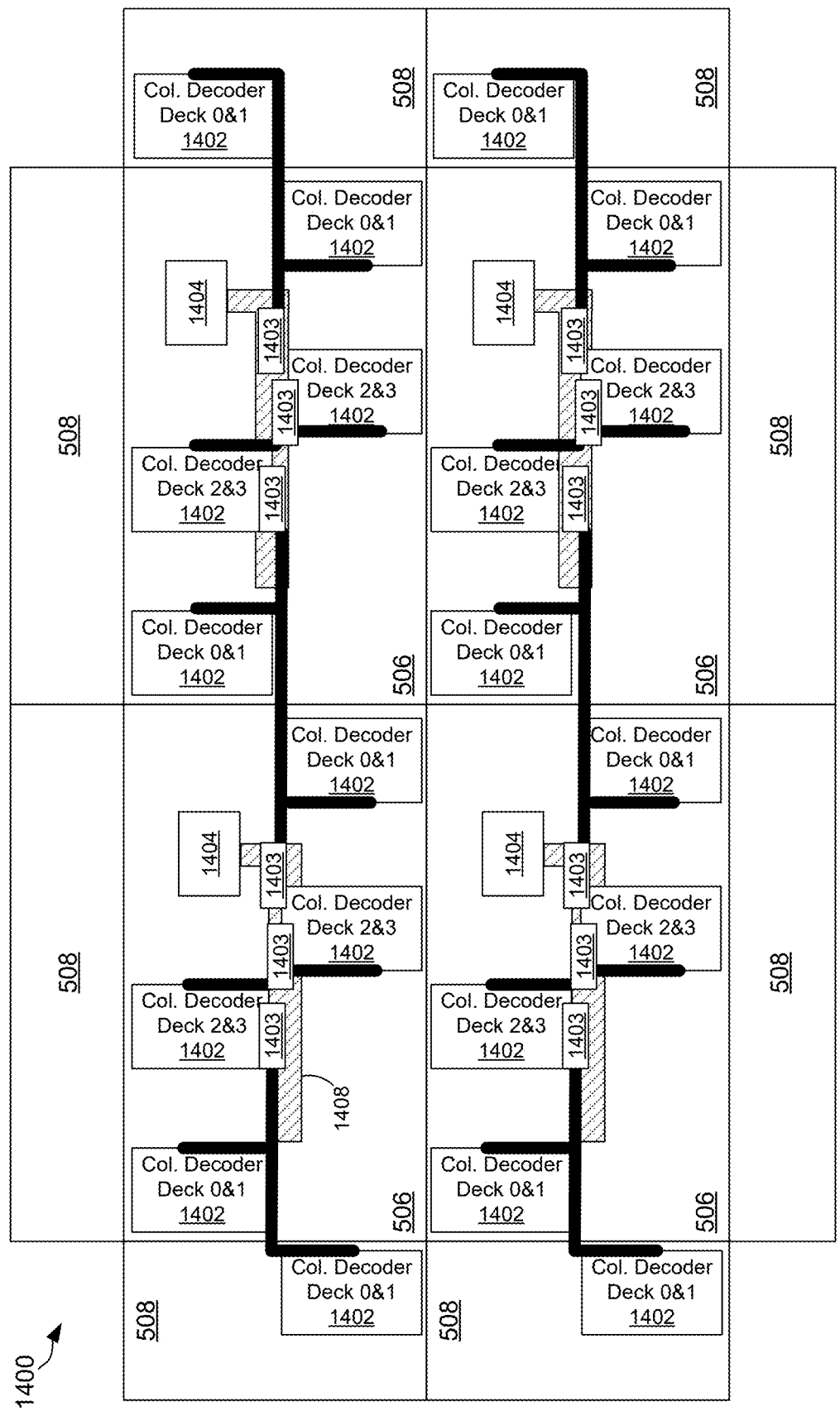
FIG. 14 illustrates a block diagram of another example bitline driver circuitry configuration according to some embodiments.

FIG. 14 illustrates a block diagram of another example bitline driver circuitry configuration according to some embodiments. In the example shown, a memory partition 1400 includes 4 main tiles 506 and 8 termination tiles 508, similar to the configuration shown in FIG. 8. However, it will be understood that aspects of the present disclosure may be applied to larger memory partitions, e.g., those with 128 or more main tiles 508 (e.g., 8 row, 16 column configurations).

As shown, each main tile 506 includes column decoder circuitry 1402 for the bitlines on the various decks of the partition. The decoders 1402 may be implemented similar to the bitline decoders described above, e.g., with respect to FIG. 9. Each column decoder circuit 1402 is attached to a bitline voltage bus 1408, which is connected to a bitline driver circuit 1404, which may be a current or voltage driver circuit in certain embodiments. In the example shown, there is one bitline voltage bus 1408 per main tile, with three selector circuits 1403 connected to the bitline voltage bus 1408. Each selector circuit 1403 in a main tile is connected to two column decoder circuits 1402. In the example shown, the left most selector circuit 1403 in each tile is connected to the left most decoder circuit 1403 in the tile and right most decoder circuit in the left adjacent tile, the middle selector circuit 1403 is connected to the decoder circuits 1402 in the center of the main tile, and the right most selector circuit 1403 in each tile is connected to the right most decoder circuit 1403 in the tile and left most decoder circuit in the right adjacent tile. The selector circuits 1403 select which decoder circuits 1402 is to be connected to the bitline voltage bus 1408.

For instance, if the driver circuit 1404 of the top left main tile 506 is to activate bitlines in its left half on deck 0 or 1, the left most selector circuit 1403 will be configured to connect its decoder circuits 1402 to the bitline voltage bus 1408 in the main tile. Likewise, if the driver circuit 1404 of the top left main tile 506 is to activate bitlines in its right half on deck 0 or 1, the right most selector circuit 1403 will be configured to connect its decoder circuits 1402 to the bitline voltage bus 1408 in the main tile. If the driver circuit 1404 of the top left main tile 506 is to activate bitlines deck 2 or 3, the middle selector circuit 1403 will be configured to connect its decoder circuits 1402 to the bitline voltage bus 1408 in the main tile.

A module as used herein may refer to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, cores 114A and 114B, I/O controller 110, CPU memory controller 112, storage device 106, system memory device 107, memory chip 116, storage device controller 118, address translation engine 120, memory partition 122, program control logic 124, chip controller 126, memory array 206, memory partition controller 310, word line control logic 314, bit line control logic 316, or other entity or component described herein, or subcomponents of any of these. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware, or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a The machine-readable storage medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage medium used in the transmission of information over the Internet via electrical, optical, acoustical or other forms of propagated signals (e.g., carrier waves, infrared signals, digital signals, etc.). Accordingly, the computer-readable medium includes any type of tangible machine-readable storage medium suitable for storing or transmitting electronic instructions or information in a form readable by a machine (e.g., a computer).

Some examples of embodiments are provided below.

Example 1 includes a non-volatile memory apparatus comprising: a plurality of memory tiles comprising a set of main memory tiles arranged in rows and columns and a set of row termination tiles at the ends of the rows and a set of column termination tiles at the ends of the columns, each main memory tile comprising: a set of address lines orthogonal to one another; memory cells between the overlapping areas of the orthogonal address lines; address line driver circuitry; and circuitry to selectively couple the address line driver circuitry to an address line decoder circuit of an adjacent memory tile to activate address lines in the main memory tile.

Example 2 includes the subject matter of Example 1, wherein each main memory tile comprises a set of bitlines and a set of wordlines orthogonal to the bitlines, the memory cells between the overlapping areas of the bitlines and wordlines, and each main memory tile comprises: wordline driver circuitry; and circuitry to selectively couple the wordline driver circuitry to a wordline line decoder circuit of an adjacent memory tile to activate wordlines in the main memory tile.

Example 3 includes the subject matter of Example 2, wherein the circuitry to selectively couple the wordline driver circuitry to a wordline line decoder circuit of an adjacent memory tile to activate wordlines in the main memory tile comprises: selector circuits coupled to respective wordline decoder circuits of the main memory tile, each selector circuit to selectively couple its corresponding wordline decoder circuit to a wordline voltage bus within the main memory tile; and multiplexer circuitry coupled to the wordline driver circuitry to selectively couple the wordline driver circuitry to either a first or second wordline voltage bus within the main memory tile, the first wordline voltage bus traversing the main memory tile and a first adjacent memory tile and the second wordline voltage bus traversing the main memory tile and a second adjacent memory tile.

Example 4 includes the subject matter of Example 2, wherein the circuitry to selectively couple the wordline driver circuitry to a wordline line decoder circuit of an adjacent memory tile to activate wordlines in the main memory tile comprises: selector circuits coupled to respective wordline decoder circuits of the main memory tile, each selector circuit to selectively couple its corresponding wordline decoder circuit to a wordline voltage bus within the main memory tile; wherein at least one wordline decoder circuit of the main memory cell is coupled to two selector circuits, each selector circuit to selectively couple the wordline decoder circuit to either the wordline driver circuitry of the main memory tile via the wordline voltage bus within the main memory tile or to wordline driver circuitry of an adjacent memory tile via a wordline voltage bus traversing the main memory tile and the adjacent memory tile.

Example 5 includes the subject matter of Example 2, wherein the circuitry to selectively couple the wordline driver circuitry to a wordline line decoder circuit of an adjacent memory tile to activate wordlines in the main memory tile comprises: pairs of selector circuits coupled to respective pairs of the wordline decoder circuits of the main memory tile, each selector circuit to selectively couple its corresponding pair of wordline decoder circuits to a wordline voltage bus within the main memory tile; wherein at least one pair of selector circuits comprises a first selector circuit to selectively couple its corresponding pair of wordline decoder circuits to the wordline driver circuitry of the main memory tile via a first wordline voltage bus within the main memory tile or to wordline driver circuitry of an adjacent memory tile via a second wordline voltage bus traversing the main memory tile and the adjacent memory tile.

Example 6 includes the subject matter of any one of Examples 1-5, wherein each main memory tile comprises a set of bitlines and a set of wordlines orthogonal to the bitlines, the memory cells between the overlapping areas of the bitlines and wordlines, and each main memory tile comprises: bitline driver circuitry; and circuitry to selectively couple the bitline driver circuitry to a bitline line decoder circuit of an adjacent memory tile to activate bitlines in the main memory tile.

Example 7 includes the subject matter of Example 6, wherein the circuitry to selectively couple the bitline driver circuitry to a bitline line decoder circuit of an adjacent memory tile to activate bitlines in the main memory tile comprises: selector circuits coupled to respective bitline decoder circuits of the main memory tile, each selector circuit to selectively couple its corresponding bitline decoder circuit to a bitline voltage bus within the main memory tile; and multiplexer circuitry coupled to the bitline driver circuitry to selectively couple the bitline driver circuitry to either a first or second bitline voltage bus within the main memory tile, the first bitline voltage bus traversing the main memory tile and a first adjacent memory tile and the second bitline voltage bus traversing the main memory tile and a second adjacent memory tile.

Example 8 includes the subject matter of Example 6, wherein the circuitry to selectively couple the bitline driver circuitry to a bitline line decoder circuit of an adjacent memory tile to activate bitlines in the main memory tile comprises: selector circuits coupled to respective pairs of bitline decoder circuits to selectively couple the bitline decoder circuits to a bitline voltage bus within the main memory tile, wherein a first selector circuit is coupled to a first bitline decoder circuit of the main memory tile and a bitline decoder circuit of a first adjacent memory tile, a second selector circuit coupled to a second and a third bitline decoder circuit of the main memory tile, and a third selector circuit coupled to a fourth bitline decoder circuit of the main memory tile and a bitline decoder circuit of a second adjacent memory tile; wherein the fourth bitline decoder circuit of the main memory tile is further coupled to a selector circuit of the second adjacent memory tile to selectively couple the fourth bitline decoder circuit to a bitline voltage bus of the second adjacent memory tile.

Example 9 includes the subject matter of any one of Examples 1-8, wherein the adjacent memory tile is a main memory tile.

Example 10 includes the subject matter of any one of Examples 1-8, wherein the adjacent memory tile is a termination tile.

Example 11 includes the subject matter of any one of Examples 1-10, wherein the termination tiles do not include address line driver circuitry.

Example 12 includes a storage device comprising: controller circuitry; and a plurality of non-volatile memory partitions coupled to the controller circuitry, each memory partition according to any one of Examples 1-11.

Example 13 includes a system comprising: a processor; and a storage device coupled to the processor, the storage device according to Example 12.

Example 14 includes the subject matter of Example 13, wherein the storage device is coupled to the processor through an I/O controller.

Example 15 includes the subject matter of Example 14, wherein the I/O controller is external to the processor.

Example 16 includes the subject matter of Example 13, further comprising volatile system memory coupled to the processor.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. A non-volatile memory apparatus comprising:
a plurality of memory tiles comprising a set of main memory tiles arranged in rows and columns and a set of row termination tiles at ends of the rows and a set of column termination tiles at ends of the columns, each main memory tile comprising:
a set of address lines orthogonal to one another;
memory cells between overlapping areas of the orthogonal address lines;
address line driver circuitry; and
circuitry to selectively couple the address line driver circuitry to an address line decoder circuit of an adjacent memory tile to activate address lines in the main memory tile.

2. The memory apparatus of claim 1, wherein each main memory tile comprises a set of bitlines and a set of wordlines orthogonal to the bitlines, the memory cells between the overlapping areas of the bitlines and wordlines, and each main memory tile comprises:
wordline driver circuitry; and
circuitry to selectively couple the wordline driver circuitry to a wordline line decoder circuit of an adjacent memory tile to activate wordlines in the main memory tile.

3. The memory apparatus of claim 2, wherein the circuitry to selectively couple the wordline driver circuitry to a wordline line decoder circuit of an adjacent memory tile to activate wordlines in the main memory tile comprises:
selector circuits coupled to respective wordline decoder circuits of the main memory tile, each selector circuit to selectively couple its corresponding wordline decoder circuit to a wordline voltage bus within the main memory tile; and
multiplexer circuitry coupled to the wordline driver circuitry to selectively couple the wordline driver circuitry to either a first or second wordline voltage bus within the main memory tile, the first wordline voltage bus traversing the main memory tile and a first adjacent memory tile and the second wordline voltage bus traversing the main memory tile and a second adjacent memory tile.

4. The memory apparatus of claim 2, wherein the circuitry to selectively couple the wordline driver circuitry to a wordline line decoder circuit of an adjacent memory tile to activate wordlines in the main memory tile comprises:
selector circuits coupled to respective wordline decoder circuits of the main memory tile, each selector circuit to selectively couple its corresponding wordline decoder circuit to a wordline voltage bus within the main memory tile;
wherein at least one wordline decoder circuit of the main memory cell is coupled to two selector circuits, each selector circuit to selectively couple the wordline decoder circuit to either the wordline driver circuitry of the main memory tile via the wordline voltage bus within the main memory tile or to wordline driver circuitry of an adjacent memory tile via a wordline voltage bus traversing the main memory tile and the adjacent memory tile.

5. The memory apparatus of claim 2, wherein the circuitry to selectively couple the wordline driver circuitry to a wordline line decoder circuit of an adjacent memory tile to activate wordlines in the main memory tile comprises:
pairs of selector circuits coupled to respective pairs of the wordline decoder circuits of the main memory tile, each selector circuit to selectively couple its corresponding pair of wordline decoder circuits to a wordline voltage bus within the main memory tile;
wherein at least one pair of selector circuits comprises a first selector circuit to selectively couple its corresponding pair of wordline decoder circuits to the wordline driver circuitry of the main memory tile via a first wordline voltage bus within the main memory tile or to wordline driver circuitry of an adjacent memory tile via a second wordline voltage bus traversing the main memory tile and the adjacent memory tile.

6. The memory apparatus of claim 1, wherein each main memory tile comprises a set of bitlines and a set of wordlines orthogonal to the bitlines, the memory cells between the overlapping areas of the bitlines and wordlines, and each main memory tile comprises:
bitline driver circuitry; and
circuitry to selectively couple the bitline driver circuitry to a bitline line decoder circuit of an adjacent memory tile to activate bitlines in the main memory tile.

7. The memory apparatus of claim 6, wherein the circuitry to selectively couple the bitline driver circuitry to a bitline line decoder circuit of an adjacent memory tile to activate bitlines in the main memory tile comprises:
selector circuits coupled to respective bitline decoder circuits of the main memory tile, each selector circuit to selectively couple its corresponding bitline decoder circuit to a bitline voltage bus within the main memory tile; and
multiplexer circuitry coupled to the bitline driver circuitry to selectively couple the bitline driver circuitry to either a first or second bitline voltage bus within the main memory tile, the first bitline voltage bus traversing the main memory tile and a first adjacent memory tile and the second bitline voltage bus traversing the main memory tile and a second adjacent memory tile.

8. The memory apparatus of claim 6, wherein the circuitry to selectively couple the bitline driver circuitry to a bitline line decoder circuit of an adjacent memory tile to activate bitlines in the main memory tile comprises:

selector circuits coupled to respective pairs of bitline decoder circuits to selectively couple the bitline decoder circuits to a bitline voltage bus within the main memory tile, wherein a first selector circuit is coupled to a first bitline decoder circuit of the main memory tile and a bitline decoder circuit of a first adjacent memory tile, a second selector circuit coupled to a second and a third bitline decoder circuit of the main memory tile, and a third selector circuit coupled to a fourth bitline decoder circuit of the main memory tile and a bitline decoder circuit of a second adjacent memory tile;

wherein the fourth bitline decoder circuit of the main memory tile is further coupled to a selector circuit of the second adjacent memory tile to selectively couple the fourth bitline decoder circuit to a bitline voltage bus of the second adjacent memory tile.

9. The memory apparatus of claim 1, wherein the adjacent memory tile is a main memory tile.

10. The memory apparatus of claim 1, wherein the adjacent memory tile is a termination tile.

11. The memory apparatus of claim 1, wherein the termination tiles do not include address line driver circuitry.

12. A storage device comprising:
controller circuitry; and
a plurality of non-volatile memory partitions coupled to the controller circuitry, each memory partition comprising a plurality of memory tiles comprising a set of main memory tiles arranged in rows and columns and a set of row termination tiles at ends of the rows and a set of column termination tiles at ends of the columns, each main memory tile comprising:
a set of address lines orthogonal to one another;
memory cells between overlapping areas of the orthogonal address lines;
address line driver circuitry; and
circuitry to selectively couple the address line driver circuitry to an address line decoder circuit of an adjacent memory tile to activate address lines in the main memory tile.

13. The storage device of claim 12, wherein each main memory tile comprises a set of bitlines and a set of wordlines orthogonal to the bitlines, the memory cells between the overlapping areas of the bitlines and wordlines, and each main memory tile comprises:
wordline driver circuitry; and
circuitry to selectively couple the wordline driver circuitry to a wordline line decoder circuit of an adjacent memory tile to activate wordlines in the main memory tile.

14. The storage device of claim 12, wherein each main memory tile comprises a set of bitlines and a set of wordlines orthogonal to the bitlines, the memory cells between the overlapping areas of the bitlines and wordlines, and each main memory tile comprises:
bitline driver circuitry; and
circuitry to selectively couple the bitline driver circuitry to a bitline line decoder circuit of an adjacent memory tile to activate bitlines in the main memory tile.

15. A system comprising:
a processor; and
a storage device coupled to the processor, the storage device comprising:
storage device controller circuitry;
a plurality of memory chips connected to the storage device controller circuitry, each memory chip comprising chip controller circuitry and a plurality of non-volatile memory partitions, each memory partition comprising a plurality of memory tiles comprising a set of main memory tiles arranged in rows and columns and a set of row termination tiles at ends of the rows and a set of column termination tiles at ends of the columns, each main memory tile comprising:
a set of address lines orthogonal to one another;
memory cells between overlapping areas of the orthogonal address lines;
address line driver circuitry; and
circuitry to selectively couple the address line driver circuitry to an address line decoder circuit of an adjacent memory tile to activate address lines in the main memory tile.

16. The system of claim 15, wherein each main memory tile comprises a set of bitlines and a set of wordlines orthogonal to the bitlines, the memory cells between the overlapping areas of the bitlines and wordlines, and each main memory tile comprises:
wordline driver circuitry; and
circuitry to selectively couple the wordline driver circuitry to a wordline line decoder circuit of an adjacent memory tile to activate wordlines in the main memory tile.

17. The system of claim 15, wherein each main memory tile comprises a set of bitlines and a set of wordlines orthogonal to the bitlines, the memory cells between the overlapping areas of the bitlines and wordlines, and each main memory tile comprises:
bitline driver circuitry; and
circuitry to selectively couple the bitline driver circuitry to a bitline line decoder circuit of an adjacent memory tile to activate bitlines in the main memory tile.

18. The system of claim 15, wherein the storage device is coupled to the processor through an I/O controller.

19. The system of claim 18, wherein the I/O controller is external to the processor.

20. The system of claim 15, further comprising volatile system memory coupled to the processor.

* * * * *